(12) United States Patent
Champlin

(10) Patent No.: US 6,294,896 B1
(45) Date of Patent: Sep. 25, 2001

(54) METHOD AND APPARATUS FOR MEASURING COMPLEX SELF-IMMITANCE OF A GENERAL ELECTRICAL ELEMENT

(76) Inventor: Keith S. Champlin, 5437 Elliot Ave. S., Minneapolis, MN (US) 55417

(*) Notice: Subject to any disclaimer, the term of this patent is extended or adjusted under 35 U.S.C. 154(b) by 0 days.

(21) Appl. No.: 09/710,031

(22) Filed: Nov. 10, 2000

Related U.S. Application Data

(63) Continuation-in-part of application No. 09/503,015, filed on Feb. 11, 2000, which is a continuation-in-part of application No. 09/454,629, filed on Dec. 3, 1999, now Pat. No. 6,172,483, which is a continuation of application No. 09/152,219, filed on Sep. 11, 1998, now Pat. No. 6,002,238.

(51) Int. Cl.$^7$ .............................. H01J 7/00; G01N 27/46
(52) U.S. Cl. ........................................... 320/134; 324/430
(58) Field of Search ........................... 320/134, DIG. 12; 324/430, 426

(56) References Cited

U.S. PATENT DOCUMENTS

| | | | |
|---|---|---|---|
| 2,514,745 | 7/1950 | Dalzell | 171/95 |
| 3,356,936 | 12/1967 | Smith | 324/29.5 |
| 3,562,634 | 2/1971 | Latner | 31/4 |

(List continued on next page.)

FOREIGN PATENT DOCUMENTS

| | | |
|---|---|---|
| 0 022 450 A1 | 1/1981 | (EP). |
| 29 26 716 B1 | 1/1981 | (DE). |
| 0 637 754 A1 | 2/1995 | (EP). |
| 0 772 056 A1 | 5/1997 | (EP). |
| 2 749 397 | 12/1997 | (FR). |
| 2 088 159 A | 6/1982 | (GB). |
| 59-17892 | 1/1984 | (JP). |
| 59-17893 | 1/1984 | (JP). |
| 59-17894 | 1/1984 | (JP). |
| 59017894 | 1/1984 | (JP). |
| 59215674 | 12/1984 | (JP). |
| 60225078 | 11/1985 | (JP). |
| 62-180284 | 8/1987 | (JP). |
| 03274479 | 12/1991 | (JP). |
| 03282276 | 12/1991 | (JP). |
| 04131779 | 5/1992 | (JP). |
| 04372536 | 12/1992 | (JP). |
| 5216550 | 8/1993 | (JP). |
| 7-128414 | 5/1995 | (JP). |
| WO 93/22666 | 11/1993 | (WO). |
| WO 98/58270 | 12/1998 | (WO). |

OTHER PUBLICATIONS

"Electrochemical Impedance Spectroscopy in Battery Development and Testing", *Batteries International*, Apr. 1997, pp. 59 and 62–63.

"Battery Impedance", by E. Willihnganz et al., *Electrical Engineering*, Sep. 1959, pp. 922–925.

(List continued on next page.)

*Primary Examiner*—Peter S. Wong
*Assistant Examiner*—Gregory J. Toatley, Jr.
(74) *Attorney, Agent, or Firm*—Westman, Champlin & Kelly, P.A.

(57) ABSTRACT

A device measures complex self-immittance of a general element at a discrete frequency by implementing "sine/cosine correlation" in software. An active source excites the element with a periodic voltage or current having fundamental period equal to the reciprocal of the desired measurement frequency. Linear circuitry senses two signals; one proportional to the periodic voltage or current excitation, the other proportional to the periodic current or voltage response. Identical low-pass or band-pass filter-response functions process each signal to remove higher-order harmonics. The resulting band-limited signals are each sampled in synchronism with the excitation, digitized, and inputted to a microprocessor or microcontroller which performs the appropriate calculations.

100 Claims, 4 Drawing Sheets

U.S. PATENT DOCUMENTS

| | | | |
|---|---|---|---|
| 3,593,099 | 7/1971 | Scholl | 320/13 |
| 3,607,673 | 9/1971 | Seyl | 204/1 |
| 3,676,770 | 7/1972 | Sharaf et al. | 324/29.5 |
| 3,729,989 | 5/1973 | Little | 73/133 |
| 3,753,094 | 8/1973 | Furuishi et al. | 324/29.5 |
| 3,808,522 | 4/1974 | Sharaf | 324/29.5 |
| 3,811,089 | 5/1974 | Streselewicz | 324/170 |
| 3,873,911 | 3/1975 | Champlin | 324/29.5 |
| 3,886,443 | 5/1975 | Miyakawa et al. | 324/29.5 |
| 3,889,248 | 6/1975 | Ritter | 340/249 |
| 3,906,329 | 9/1975 | Bader | 320/44 |
| 3,909,708 | 9/1975 | Champlin | 324/29.5 |
| 3,936,744 | 2/1976 | Perlmutter | 324/158 |
| 3,946,299 | 3/1976 | Christianson et al. | 320/43 |
| 3,947,757 | 3/1976 | Grube et al. | 324/28 |
| 3,969,667 | 7/1976 | McWilliams | 324/29.5 |
| 3,979,664 | 9/1976 | Harris | 324/17 |
| 3,984,762 | 10/1976 | Dowgiallo, Jr. | 324/29.5 |
| 3,984,768 | 10/1976 | Staples | 324/62 |
| 3,989,544 | 11/1976 | Santo | 429/65 |
| 4,008,619 | 2/1977 | Alcaide et al. | 73/398 |
| 4,053,824 | 10/1977 | Dupuis et al. | 324/29.5 |
| 4,070,624 | 1/1978 | Taylor | 327/158 |
| 4,086,531 | 4/1978 | Bernier | 324/158 |
| 4,112,351 | 9/1978 | Back et al. | 324/16 |
| 4,114,083 | 9/1978 | Benham et al. | 320/39 |
| 4,126,874 | 11/1978 | Suzuki et al. | 354/60 |
| 4,178,546 | 12/1979 | Hulls et al. | 324/158 |
| 4,193,025 | 3/1980 | Frailing et al. | 324/427 |
| 4,207,611 | 6/1980 | Gordon | 364/580 |
| 4,315,204 | 2/1982 | Sievers et al. | 322/28 |
| 4,316,185 | 2/1982 | Watrous et al. | 340/636 |
| 4,322,685 | 3/1982 | Frailing et al. | 324/429 |
| 4,363,407 | 12/1982 | Barkler et al. | 209/3.3 |
| 4,369,407 | 1/1983 | Korbell | 324/416 |
| 4,379,990 | 4/1983 | Sievers et al. | 322/99 |
| 4,390,828 | 6/1983 | Converse et al. | 320/32 |
| 4,392,101 | 7/1983 | Saar er al. | 320/20 |
| 4,396,880 | 8/1983 | Windebank | 320/21 |
| 4,408,157 | 10/1983 | Beaubien | 324/62 |
| 4,412,169 | 10/1983 | Dell'Orto | 320/64 |
| 4,423,378 | 12/1983 | Marino et al. | 324/427 |
| 4,423,379 | 12/1983 | Jacobs et al. | 324/429 |
| 4,424,491 | 1/1984 | Bobbett et al. | 324/433 |
| 4,459,548 | 7/1984 | Lentz et al. | 324/158 |
| 4,514,694 | 4/1985 | Finger | 324/429 |
| 4,520,353 | 5/1985 | McAuliffe | 340/636 |
| 4,667,279 | 5/1987 | Maier | 363/46 |
| 4,678,998 | 7/1987 | Muramatsu | 324/427 |
| 4,679,000 | 7/1987 | Clark | 324/428 |
| 4,697,134 | 9/1987 | Burkum et al. | 320/48 |
| 4,707,795 | 11/1987 | Alber et al. | 364/550 |
| 4,709,202 | 11/1987 | Koenck et al. | 320/43 |
| 4,710,861 | 12/1987 | Kanner | 363/46 |
| 4,719,428 | 1/1988 | Liebermann | 324/436 |
| 4,743,855 | 5/1988 | Randin et al. | 324/430 |
| 4,745,349 | 5/1988 | Palanisamy et al. | 320/22 |
| 4,816,768 | 3/1989 | Champlin | 324/428 |
| 4,820,966 | 4/1989 | Fridman | 320/32 |
| 4,825,170 | 4/1989 | Champlin | 324/436 |
| 4,849,700 | 7/1989 | Morioka et al. | 324/427 |
| 4,876,495 | 10/1989 | Palanisamy et al. | 320/18 |
| 4,881,038 | 11/1989 | Champlin | 324/426 |
| 4,912,416 | 3/1990 | Champlin | 324/430 |
| 4,929,931 | 5/1990 | McCuen | 340/636 |
| 4,931,798 | 6/1990 | MacIntyre et al. | 324/435 |
| 4,937,528 | 6/1990 | Palanisamy | 324/430 |
| 4,947,124 | 8/1990 | Hauser | 324/430 |
| 4,956,597 | 9/1990 | Heavey et al. | 320/14 |
| 4,968,941 | 11/1990 | Rogers | 324/428 |
| 4,968,942 | 11/1990 | Palanisamy | 324/430 |
| 5,004,979 | 4/1991 | Marino et al. | 324/160 |
| 5,032,825 | 7/1991 | Xuznicki | 340/636 |
| 5,047,722 | 9/1991 | Wurst et al. | 324/430 |
| 5,087,881 | 2/1992 | Peacock | 324/378 |
| 5,126,675 | 6/1992 | Yang | 324/435 |
| 5,140,269 | 8/1992 | Champlin | 324/433 |
| 5,144,218 | 9/1992 | Bosscha | 320/44 |
| 5,144,248 | 9/1992 | Alexandres et al. | 324/428 |
| 5,170,124 | 12/1992 | Blair et al. | 324/434 |
| 5,179,335 | 1/1993 | Nor | 320/21 |
| 5,204,611 | 4/1993 | Nor et al. | 320/21 |
| 5,214,370 | 5/1993 | Harm et al. | 320/35 |
| 5,214,385 | 5/1993 | Gabriel et al. | 324/434 |
| 5,241,275 | 8/1993 | Fang | 324/430 |
| 5,254,952 | 10/1993 | Salley et al. | 324/429 |
| 5,266,880 | 11/1993 | Newland | 320/14 |
| 5,281,919 | 1/1994 | Palanisamy | 324/427 |
| 5,281,920 | 1/1994 | Wurst | 324/430 |
| 5,295,078 | 3/1994 | Stich et al. | 364/483 |
| 5,298,797 | 3/1994 | Redl | 307/246 |
| 5,300,874 | 4/1994 | Shimamoto et al. | 320/15 |
| 5,302,902 | 4/1994 | Groehl | 324/434 |
| 5,315,287 | 5/1994 | Sol | 340/455 |
| 5,331,268 | 7/1994 | Patino et al. | 320/20 |
| 5,336,993 | 8/1994 | Thomas et al. | 324/158.1 |
| 5,343,380 | 8/1994 | Champlin | 363/46 |
| 5,352,968 | 10/1994 | Reni et al. | 320/35 |
| 5,365,160 | 11/1994 | Leppo et al. | 320/22 |
| 5,365,453 | 11/1994 | Startup et al. | 364/481 |
| 5,381,096 | 1/1995 | Hirzel | 324/427 |
| 5,426,371 | 6/1995 | Salley et al. | 324/429 |
| 5,432,426 | 7/1995 | Yoshida | 320/20 |
| 5,434,495 | 7/1995 | Toko | 320/44 |
| 5,442,274 | 8/1995 | Tamai | 320/23 |
| 5,449,996 | 9/1995 | Matsumoto et al. | 320/20 |
| 5,449,997 | 9/1995 | Gilmore et al. | 320/39 |
| 5,451,881 | 9/1995 | Finger | 324/433 |
| 5,457,377 | 10/1995 | Jonsson | 320/5 |
| 5,469,043 | 11/1995 | Cherng et al. | 320/31 |
| 5,485,090 | 1/1996 | Stephens | 324/433 |
| 5,488,300 | 1/1996 | Jamieson | 324/432 |
| 5,519,383 | 5/1996 | De La Rosa | 340/636 |
| 5,528,148 | 6/1996 | Rogers | 324/426 |
| 5,546,317 | 8/1996 | Andrieu | 364/481 |
| 5,550,485 | 8/1996 | Falk | 324/772 |
| 5,561,380 | 10/1996 | Sway-Tin et al. | 324/509 |
| 5,562,501 | 10/1996 | Kinoshita et al. | 439/852 |
| 5,572,136 | 11/1996 | Champlin | 324/426 |
| 5,574,355 | 11/1996 | McShane et al. | 320/39 |
| 5,583,416 | 12/1996 | Klang | 320/22 |
| 5,585,728 | 12/1996 | Champlin | 324/427 |
| 5,589,757 | 12/1996 | Klang | 320/22 |
| 5,592,093 | 1/1997 | Klingbiel | 324/426 |
| 5,596,260 | 1/1997 | Moravec et al. | 320/30 |
| 5,598,098 | 1/1997 | Champlin | 324/430 |
| 5,602,462 | 2/1997 | Stich et al. | 323/258 |
| 5,606,242 | 2/1997 | Hull et al. | 320/48 |
| 5,621,298 | 4/1997 | Harvey | 320/5 |
| 5,642,031 | 6/1997 | Brotto | 320/21 |
| 5,650,937 | 7/1997 | Bounaga | 364/483 |
| 5,652,501 | 7/1997 | McClure et al. | 320/17 |
| 5,656,920 | 8/1997 | Cherng et al. | 320/31 |
| 5,675,234 | 10/1997 | Greene | 320/15 |
| 5,677,077 | 10/1997 | Faulk | 429/90 |
| 5,699,050 | 12/1997 | Kanazawa | 340/636 |
| 5,701,089 | 12/1997 | Perkins | 327/772 |
| 5,705,929 | 1/1998 | Caravello et al. | 324/430 |
| 5,710,503 | 1/1998 | Sideris et al. | 320/6 |
| 5,717,336 | 2/1998 | Basell et al. | 324/430 |
| 5,717,937 | 2/1998 | Fritz | 395/750.01 |

| | | | |
|---|---|---|---|
| 5,757,192 | 5/1998 | McShane et al. | 324/427 |
| 5,760,587 | 6/1998 | Harvey | 324/434 |
| 5,773,978 | 6/1998 | Becker | 324/430 |
| 5,789,899 | 8/1998 | van Phuoc etal. | 320/30 |
| 5,793,359 | 8/1998 | Ushikubo | 345/169 |
| 5,808,469 | 9/1998 | Kopera | 324/43.4 |
| 5,821,756 | 10/1998 | McShane et al. | 324/430 |
| 5,831,435 | 11/1998 | Troy | 324/426 |
| 5,862,515 | 1/1999 | Kobayashi et al. | 702/63 |
| 5,872,443 | 2/1999 | Williamson | 320/21 |
| 5,895,440 | 4/1999 | Proctor et al. | 702/63 |
| 5,914,605 | 6/1999 | Bertness | 324/430 |
| 5,929,609 | 7/1999 | Joy et al. | 322/25 |
| 5,945,829 | 8/1999 | Bertness | 324/430 |
| 6,002,238 | 12/1999 | Champlin | 320/134 |
| 6,008,652 | 12/1999 | Theofanopoulos et al. | 324/434 |
| 6,009,369 | 12/1999 | Boisvert et al. | 701/99 |
| 6,031,354 | 2/2000 | Wiley et al. | 320/116 |
| 6,037,751 | 3/2000 | Klang | 320/160 |
| 6,037,777 | 3/2000 | Champlin | 324/430 |
| 6,051,976 | 4/2000 | Bertness | 324/426 |
| 6,072,299 | 6/2000 | Kurie et al. | 320/112 |
| 6,072,300 | 6/2000 | Tsuji | 320/116 |
| 6,081,098 | 6/2000 | Bertness et al. | 320/134 |
| 6,091,245 | 7/2000 | Bertness | 324/426 |
| 6,094,033 | 7/2000 | Ding et al. | 320/132 |
| 6,104,167 | 8/2000 | Bertness et al. | 320/132 |
| 6,137,269 | 10/2000 | Champlin | 320/150 |
| 6,163,156 | 12/2000 | Bertness | 324/426 |
| 6,172,483 * | 1/2001 | Champlin | 320/134 |
| 6,172,505 | 1/2001 | Bertness | 324/430 |

OTHER PUBLICATIONS

"Determining The End of Battery Life", by S. DeBardelaben, *IEEE,* 1986, pp. 365–368.

"A Look at the Impedance of a Cell", by S. Debardelaben, *IEEE,* 1988, pp. 394–397.

"The Impedance of Electrical Storage Cells", by N.A. Hampson et al., *Journal of Applied Electrochemistry,* 1980, pp. 3–11.

"A Package for Impedance/Admittance Data Analysis", by B. Boukamp, *Solid State Ionics,* 1986, pp. 136–140.

"Precision of Impedance Spectroscopy Estimates of Bulk, Reaction Rate, and Diffusion Parameters", by J. Macdonald et al., *J. Electroanal, Chem.,* 1991, pp. 1–11.

Internal Resistance: Harbinger of Capacity Loss in Starved Electrolyte Sealed Lead Acid Batteries, by Vaccaro, F.J. et al., AT&T Bell Laboratories, 1987 IEEE, Ch. 2477, pp. 128,131.

IEEE Recomended Practice For Maintenance, Testing, and Replacement of Large Lead Storage Batteries for Generating Stations and Substations, The Institute of Electrical and Electronics Engineers, Inc., *ANSI/IEEE Std.* 450–1987, Mar. 9, 1987, pp. 7–15.

"Field and Laboratory Studies to Assess the State of Health of Valve–Regulated Lead Acid Batteries: Part I Conductance/Capacity Correlation Studies", by D. Feder et al., *IEEE,* Aug. 1992, pp. 218–233.

"JIS Japanese Industrial Standard–Lead Acid Batteries for Automobiles", *Japanese Standards Association UDS,* 621.355.2:629.113.006, Nov. 1995.

"Performance of Dry Cells", by C. Hambuechen, Preprint of *Am. Electrochem. Soc.,* Apr. 18–20, 1912, paper No. 19, pp. 1–5.

"A Bridge for Measuring Storage Battery Resistance", by E. Willihncanz, *The Electrochemical Society,* preprint 79–20, Apr. 1941, pp. 253–258.

U.S. application No. 09/388,501, Champlin, filed Sep. 1, 1999.

U.S. application No. 09/503,015, Champlin, filed Feb. 11, 2000.

* cited by examiner

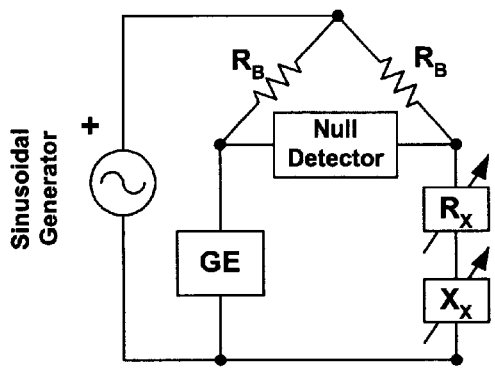
Fig. 1a Prior Art
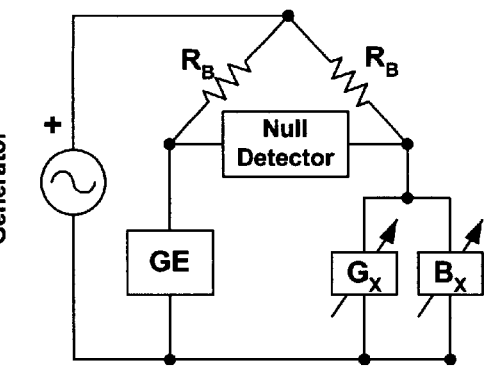
Fig. 1b
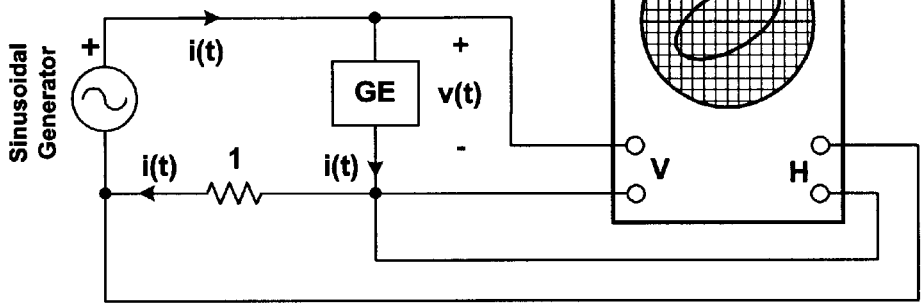
Prior Art Fig. 2
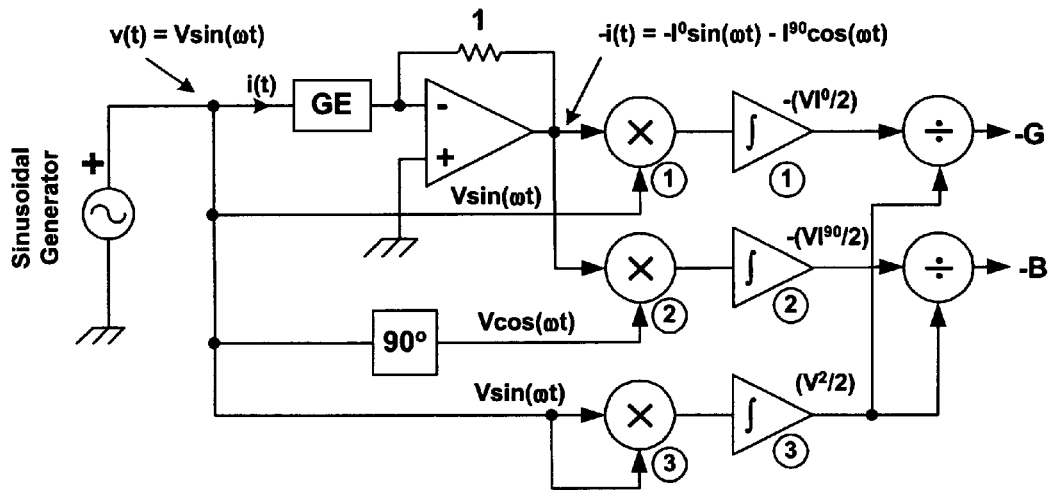
Prior Art Fig. 3

// METHOD AND APPARATUS FOR MEASURING COMPLEX SELF-IMMITTANCE OF A GENERAL ELECTRICAL ELEMENT

This application is a Continuation-In-Part of application Ser. No. 09/503,015, filed Feb. 11, 2000 which is a Continuation-In-Part of application Ser. No. 09/454,629, filed Dec. 3, 1999, now U.S. Pat. No. 6,172,483 which is a Continuation of application Ser. No. 09/152,219, filed Sep. 11, 1998, now U.S. Pat. No. 6,002,238.

BACKGROUND OF THE INVENTION

Self-immittance refers to either impedance, or its reciprocal, admittance, measured between a single pair of terminals. At a given discrete frequency, self-immittance is a complex quantity. As such, it contains two components and can be expressed as either magnitude and phase, or real and imaginary parts. These two alternative forms of complex self-impedance/admittance are equivalent.

Patents have recently been applied for by Champlin which are directed to a technique for measuring complex self-immittance of electrochemical cells and batteries (see U.S. Pat. No. 6,002,238, U.S. patent application Ser. No. 09/454,629, and U.S. patent application Ser. No. 09/503,015). Special provisions of that technique take into account the very low impedance level and the intrinsic internal voltage of a cell or battery. One aspect of the present invention includes measuring complex self-impedance/admittance of a general two-terminal electrical element having arbitrary impedance and that may, or may not, contain an internal voltage source.

Balanced bridge methods for measuring complex self-immittance at a discrete frequency are well known. Two examples are shown in FIGS. 1a and 1b. FIG. 1a illustrates a bridge circuit for directly measuring real and imaginary parts of the complex self-impedance, Z=R+jX, of a general element denoted GE, where j=√−1. FIG. 1b illustrates a bridge for directly measuring a general element's real and imaginary parts of self-admittance, Y=G+jB. Although complex Z and Y are related by the reciprocal relationship Y=1/Z, the same is not true of their real and imaginary components (G≠1/R, B≠1/X). Hence, the distinctly different bridge circuits.

Consider either FIG. 1a or FIG. 1b. At a given frequency of the sinusoidal generator, one adjusts the calibrated variable resistance or conductance element, $R_X$ or $G_X$, and the calibrated variable reactance or susceptance element, $X_X$ or $B_X$, for bridge balance as indicated by the null detector. By virtue of the equal resistors $R_B$ on either side of the bridge, the balance condition indicates that $R_X$=R and $X_X$=X (FIG. 1a) or $G_X$=G and $B_X$=B (FIG. 1b). Accordingly, the real and imaginary parts of the unknown self-immittance, either Z=R+jX or Y=G+jB, can be read directly from the calibrated values of the appropriate two variable elements.

Bridge methods for measuring complex self-immittance suffer from several disadvantages. First of all, obtaining an accurate balance condition is a very time-consuming procedure that generally requires exceptional skill. Secondly, bridge accuracy is critically dependent upon the calibration accuracy of the variable elements. Finally, calibrated reactance and susceptance elements that are variable over a wide adjustment range are very difficult to implement.

A second prior-art technique for measuring complex self-immittance of a general element at a particular discrete frequency is illustrated in FIG. 2. In this circuit, a sinusoidal current i(t) excites the unknown element. This excitation current is sensed across a "viewing" resistor, which, for simplicity, is assumed to be 1 ohm. Accordingly, in this example, the sensed current-signal voltage across the resistor is numerically equal to i(t). This excitation current signal is presented to the horizontal input of an oscilloscope, and the responding voltage signal across the general element, v(t), is presented to the vertical input. The resulting display is known as a single-loop Lissajous' pattern.

If, for simplicity, the horizontal and vertical gains are chosen to be equal, one can determine the magnitude and phase of the unknown self-impedance directly from the displayed Lissajous' pattern. The magnitude is simply the ratio of maximum vertical excursion to maximum horizontal excursion, and the phase angle is the inverse sine of the ratio of zero-crossing point to maximum excursion. Although this Lissajous' pattern technique is very simple, it is not particularly accurate since it depends critically upon the operator's visual acuity.

A third prior-art method for measuring discrete-frequency complex self-admittance of a general element—a method that is closely related to the present invention—is illustrated in FIG. 3. This technique utilizes apparatus, often referred to as a "frequency response analyzer" (FRA), implementing a measuring technique known as "sine/cosine correlation".

Consider FIG. 3. A sinusoidal generator generates zero-phase reference voltage v(t)=V sin(ωt). Because of the feedback-induced "virtual short-circuit" at the input of the operational amplifier, reference voltage v(t) appears directly across the unknown GE, and thus serves as its excitation. The responding current through the GE can be written in the form i(t)=$I^0$ sin(ωt)+$I^{90}$ cos(ωt) where $I^0$ is the amplitude of the current component that is in time-phase with the reference voltage, and $I^{90}$ is the amplitude of the component in time-quadrature. Assuming for simplicity that the feedback resistor is 1 ohm, the voltage signal at the output of the operational amplifier is numerically equal to −i(t). Thus, the operational amplifier serves as a current-to-voltage converter.

The two signals, v(t) and −i(t), are multiplied together in a first hardware multiplier. The multiplier's output is the product −VI$^0$ sin$^2$(ωt)−VI$^{90}$ sin(ωt)cos(ωt), which, by using well-known trigonometric identities, can be written −(VI$^0$/2)+(VI$^0$/2)cos(2ωt)−(VI$^{90}$/2)sin(2ωt). Integrating this signal with a first hardware integrator (low-pass filter) removes the two time-varying components leaving only the dc voltage −(VI$^0$/2).

The two signals at the inputs of the second multiplier are −i(t) and a signal V cos(ωt) obtained by shifting v(t) in time-phase by 90°. Again by using well-known trigonometric identities, the multiplier's output can be shown to be −(VI/2)sin(2ωt)−(VI$^{90}$/2)−(VI$^{90}$/2)cos(2ωt). Integrating this signal with a second hardware integrator removes the two time-varying components leaving only the dc voltage −(VI$^{90}$/2).

Both inputs of the third multiplier are v(t)=V sin(ωt). The output signal is therefore $V^2$ sin$^2$(ωt) which, by using a trigonometric identity, can be shown to be equivalent to ($V^2$/2)−($V^2$/2)cos(2ωt). Integrating this signal with a third hardware integrator removes the time-varying component leaving only the dc voltage ($V^2$/2).

Finally, the dc outputs of the first and second integrators are divided by the dc output of the third integrator. These two divisions yield −G=(−$I^0$/V) and −B=(−$I^{90}$/V), respectively, the negative real and imaginary parts of admittance Y=G+jB of the unknown element. Thus, by employing a zero-phase reference voltage as excitation and sensing the resulting in-phase and quadrature components of current response, the apparatus of FIG. 3 fundamentally measures components of complex self-admittance. One sees further that this technique employs hardware devices to evaluate the two correlation integrals $\int i(t)\sin(\omega t)dt$ and $\int i(t)\cos(\omega t)dt$. Hence the name "sine/cosine correlation".

Improvements and variations on this basic "sine/cosine correlation" technique have been described by Jackson in U.S. Pat. No. 3,808,526; by Allison in U.S. Pat. No. 4,322,806; by Sugihara in U.S. Pat. No. 4,409,543; by Ryder in U.S. Pat. No. 4,868,487; by Wakasugi, et al., in U.S. Pat. No. 4,888,701; by Kitayoshi in U.S. Pat. No. 4,947,130; by Wakasugi in U.S. Pat. No. 4,935,692; and by Park in U.S. Pat. No. 5,519,325.

SUMMARY OF THE INVENTION

The present invention eliminates the hardware multipliers, integrators, and phase shifter of the above "sine/cosine correlation" technique. Complex self-immittance of a general electrical element is measured at a discrete frequency by implementing "sine/cosine correlation" in software. This mathematical determination is exact when the measurement signals are appropriately band limited.

An active time-varying source excites the unknown element with a periodic voltage or periodic current having fundamental period equal to the reciprocal of the desired measurement frequency. Linear circuitry senses two time-varying signals; one proportional to the periodic voltage or current excitation; the other proportional to the periodic current or voltage response. Identical low-pass or band-pass filter-response functions process each signal to remove higher-order harmonics. The resulting band-limited signals are each sampled in synchronism with the excitation; samples being acquired at three or more equally spaced times over a period of the excitation and over one or more consecutive periods. Digital representations of the sampled signals are inputted to a microprocessor or microcontroller, averaged or summed over consecutive periods, multiplied by appropriate sine/cosine values, and summed numerically to evaluate "sine/cosine correlation" integrals. The microprocessor/controller combines the numerically computed integrals mathematically to evaluate the components of complex self-immittance of the general element.

BRIEF DESCRIPTION OF THE DRAWINGS

FIG. 1a is a simplified representation of a bridge circuit used to determine real and imaginary parts of complex self-impedance of a general element at a discrete frequency.

FIG. 1b is a simplified representation of a bridge circuit used to determine real and imaginary parts of complex self-admittance of a general element at a discrete frequency.

FIG. 2 is a simplified representation of apparatus used to determine magnitude and phase of complex self-impedance by the Lissajous' pattern method.

FIG. 3 is a simplified representation of Frequency Response Analyzer (FRA) apparatus used to measure real and imaginary parts of the complex self-admittance of a general element by sine/cosine correlation.

DETAILED DESCRIPTION OF THE PREFERRED EMBODIMENTS

Figure 4:
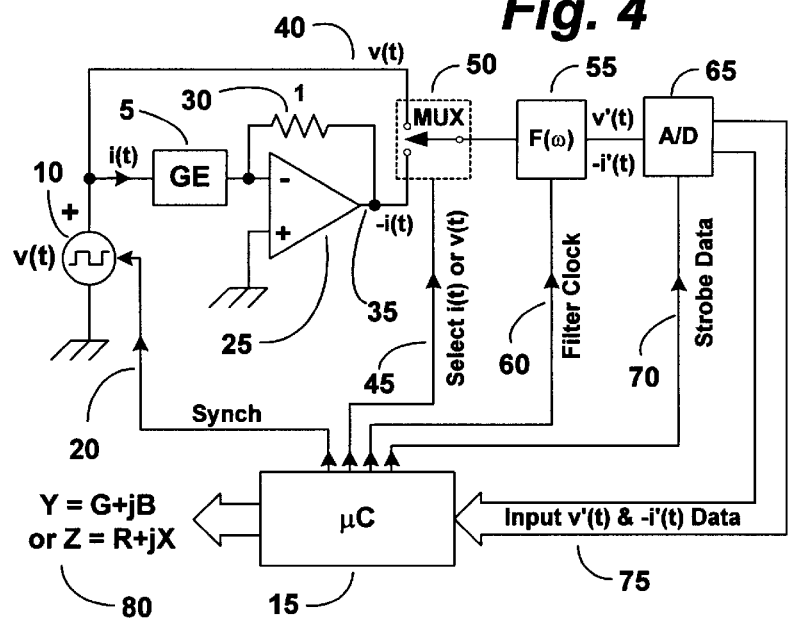
FIG. 4 is a block-diagram of a first embodiment of apparatus for measuring complex self-immittance of a general element at a discrete measuring frequency in accordance with the present invention.

FIG. 4 discloses a block-diagram of a first embodiment of apparatus for measuring complex self-immittance of a general element (GE) 5, at a discrete measuring frequency in accordance with the present invention. An active time-varying voltage source 10 generates a periodic voltage v(t) having fundamental period equal to the reciprocal of the desired measuring frequency. Periodic voltage v(t) may comprise a sinusoid, a square wave, a triangle wave, or any other periodic waveform. The timing of periodic voltage v(t)

is controlled by microprocessor/controller 15 via synchronization path 20. Because of the feedback-induced "virtual short-circuit" at the input of operational amplifier 25, voltage v(t) appears directly across the unknown general element 5 and thus serves as its excitation. Assuming for simplicity that feedback resistor 30 is 1 ohm, the response of GE 5, current i(t), is numerically equal to the negative of the voltage signal at the output 35 of operational amplifier 25 –i(t). Thus, operational amplifier 25 serves as a current-to-voltage converter to detect the response.

Under control of microprocessor/controller 15 via control path 45, multiplexer 50 selects either –i(t) signal 35 or v(t) signal 40 for presentation to the input of band-limiting filter 55. The response function $F(\omega)$ of filter 55 may comprise either a low-pass response function or a band-pass response function. In addition, filter 55 may comprise either conventional fixed-tuned circuitry or switched-capacitor circuitry having cutoff- or center-frequency under program control via filter clock path 60. The primary function of band-limiting filter 55 is to eliminate higher-order harmonics that cause frequency "aliasing" errors. It also serves to attenuate noise. Note that both v(t) and –i(t) signals are processed by the same filter response function $F(\omega)$ to yield band-limited signals v'(t) and –i'(t). Accordingly, both the attenuation and the phase-shift of $F(\omega)$ cancel out of the subsequent determination of complex self-immittance of element 5.

Analog to digital converter 65 accepts band-limited signals v'(t) and –i'(t) as inputs. Microprocessor/controller 15 strobes these data in synchronism with the waveform of source 10 via control path 70. The resulting digital samples of v'(t) and –i'(t)—acquired at three or more equally spaced times over an excitation period and over one or more consecutive excitation periods—are inputted to microprocessor/controller 15 via data path 75. Using mathematical techniques that are fully disclosed below, microprocessor/controller 15 calculates components of complex self-immittance 80 of GE 5 from these synchronously acquired digital data samples.

Since the apparatus of FIG. 4, like that of FIG. 3, employs voltage excitation and current response, it may be considered means for measuring components of complex self-admittance Y=G+jB. However, as will be explained fully below, the excitation signal will not be assumed a zero-phase reference. Accordingly, excitation and response are mathematically symmetrical, and the apparatus of FIG. 4 can just as well be considered means for determining complex self-impedance.

Figure 5:
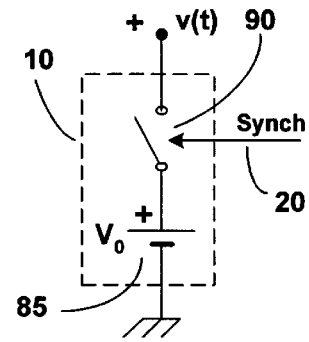
FIG. 5 is a simplified representation of a possible periodic voltage source for use with the apparatus of FIGS. 4, 8 and 9.

FIG. 5 discloses a very simple active periodic voltage source 10 appropriate to the apparatus of FIG. 4, as well as to apparatus disclosed below in FIGS. 8 and 9. A source of constant voltage $V_O$ 85 is placed in series with a controlled switch 90 that may comprise a MOSFET or bipolar transistor operating in its switch mode. Microprocessor/controller 15 commands controlled switch 90 to periodically turn "on" and "off" via command path 20. Accordingly, voltage v(t) comprises a square-wave signal having peak-to-peak amplitude $V_O$ along with dc bias component $DV_O$, where D is the duty-cycle of the switch. As will be seen below, the dc bias component is of no consequence. Note that the simple apparatus of FIG. 5 quite naturally provides the necessary synchronization between microprocessor/controller 15 and active voltage source 10 that is required by the apparatus of FIG. 4 for synchronous acquisition of the data samples.

Figure 6:
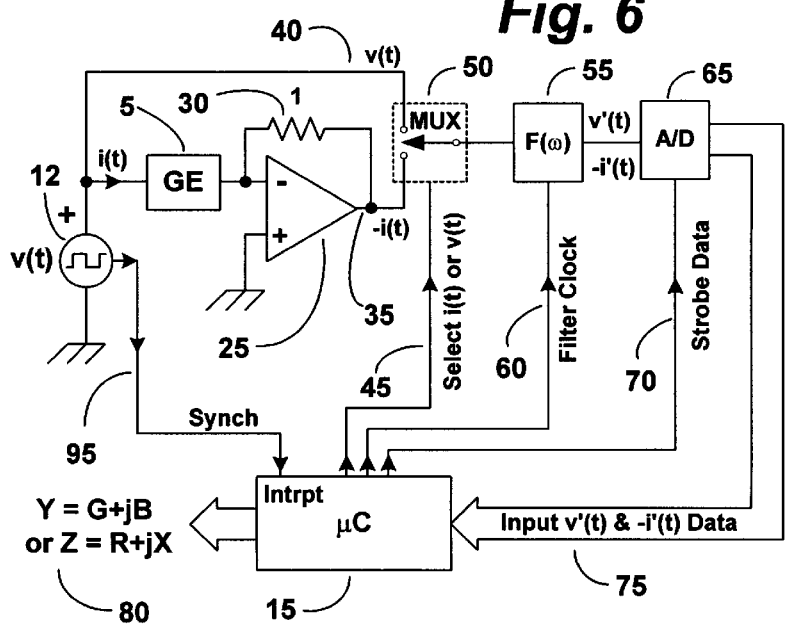
FIG. 6 is a block-diagram of a second embodiment of apparatus for measuring complex self-immittance of a general element at a discrete measuring frequency in accordance with the present invention.

FIG. 6 discloses apparatus of a second embodiment for measuring complex self-immittance of a general element at a discrete measuring frequency in accordance with the present invention. The embodiment of FIG. 6 functions identically to that disclosed in FIG. 5 except for the way that synchronization between active voltage source 10 and microprocessor/controller 15 is implemented. In FIG. 4, microprocessor/controller 15 initiates synchronization pulses that are communicated to active voltage source 10 via synchronization path 20. The opposite occurs in the apparatus of FIG. 6. Time-varying active voltage source 12 generates a periodic voltage v(t) along with periodic synchronization pulses completely independently of microprocessor/controller 15. The synchronization pulses are communicated to microprocessor/controller 15 via reverse synchronization path 95 and issue interrupts thereupon. A software routine servicing these interrupts provides timing references to identify the appropriate data acquisition times.

Figure 7:
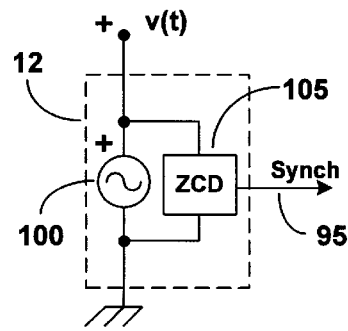
FIG. 7 is a simplified representation of a possible periodic voltage source for use with the apparatus of FIG. 6.

FIG. 7 discloses one possible periodic active voltage source 12 providing such external synchronization. Voltage generator 100, which may, e.g., be a sinusoidal, triangle wave, or square wave voltage generator, generates a periodic voltage waveform v(t). In addition, circuitry 105, which may comprise a zero-crossing detector, generates pulses that identify periodically occurring timing points of the v(t) waveform. These pulses are communicated to microprocessor/controller 15 via reverse synchronization path 95 and provide interrupts for synchronization of the software.

Figure 8:
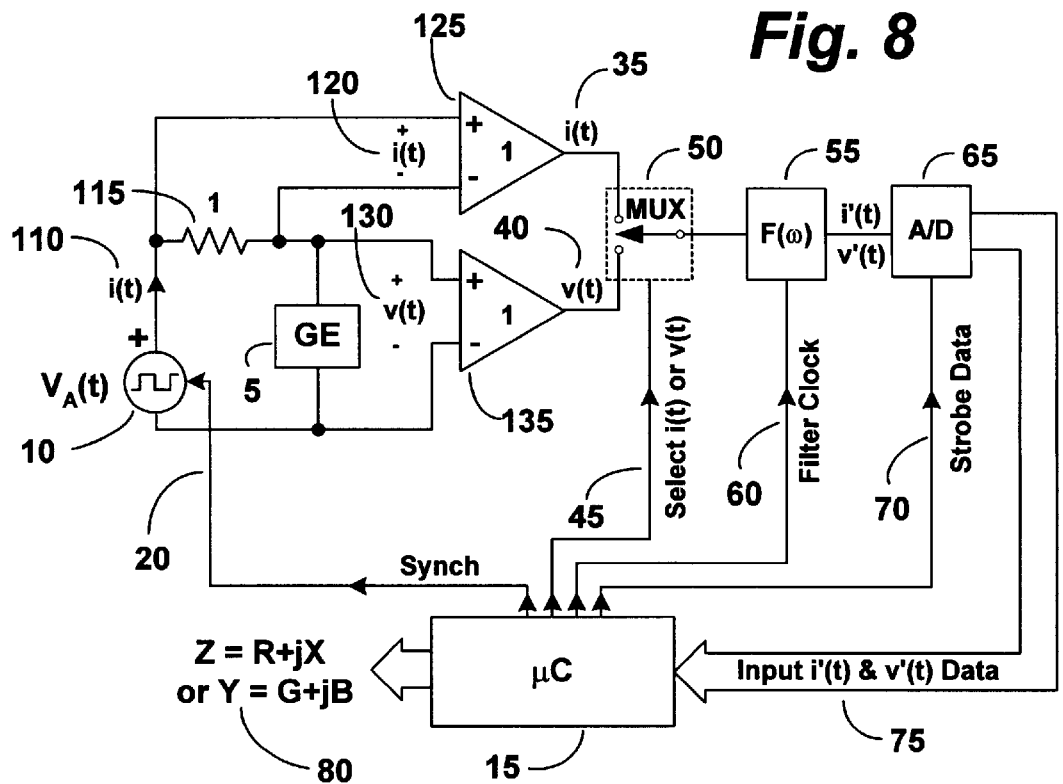
FIG. 8 is a block-diagram of a third embodiment of apparatus for measuring complex self-immittance of a general element at a discrete measuring frequency in accordance with the present invention.

FIG. 8 discloses a third embodiment of apparatus for measuring complex self-immittance of a general element at a discrete measuring frequency in accordance with the present invention. This embodiment differs from the embodiments disclosed in FIGS. 4 and 6 in that a current serves as excitation and a voltage serves as response rather than a voltage serving as excitation and a current serving as response. A time-varying active voltage source 10 generates a periodic voltage $V_A(t)$ having fundamental period equal to the reciprocal of the desired measuring frequency. Periodic voltage $V_A(t)$ may comprise a sinusoid, a square wave, or any other periodic waveform. Again, the timing of active voltage source 10 is derived from microprocessor/controller 15 via synchronization path 20 and may therefore comprise apparatus such as that disclosed in FIG. 5. Periodic voltage $V_A(t)$ causes current i(t) 110 to flow through the series combination of "viewing" resistor 115 and general element (GE) 5. Current i(t) thus serves as active excitation of general element 5. Assuming for simplicity that the resistance of "viewing" resistor 115 is 1 ohm, the signal voltage developed across resistor 115 is numerically equal to the current excitation i(t). This current signal 120 is applied to the input of differential amplifier 125, and v(t) 130, the voltage response developed across general element 5, is applied to the input of differential amplifier 135. Assuming for simplicity that the voltage gains of differential amplifiers 125 and 135 are each unity, the two signals at the outputs 35 and 40 of these amplifiers are equal to i(t) and v(t), respectively.

Under programmed control of microprocessor/controller 15 via control path 45, multiplexer 50 selects either i(t) signal at 35 or v(t) signal at 40 for presentation to the input of band-limiting filter 55. The response function $F(\omega)$ of filter 55 may comprise either a low-pass response function or a band-pass response function. In addition, filter 55 may comprise either conventional fixed-tuned circuitry or switched-capacitor circuitry having cutoff- or center-frequency under program control via filter clock path 60. The primary function of band-limiting filter 55 is to eliminate higher-order harmonics that cause frequency "aliasing"

errors. It also serves to attenuate noise. Note that both v(t) and i(t) signals are processed by the same filter response function F(ω) to yield band-limited signals v'(t) and i'(t). Accordingly, both the attenuation and the phase-shift of F(ω) cancel out of the subsequent determination of complex self-immittance of general element 5.

Analog to digital converter 65 accepts band-limited signals v'(t) and i'(t) as inputs. Microprocessor/controller 15 strobes these data in synchronism with excitation source 10 via control path 70. The resulting digital samples of v'(t) and i'(t)—acquired at three or more equally spaced times over an excitation period and over one or more consecutive excitation periods—are inputted to microprocessor/controller 15 via data path 75. Using mathematical techniques that are fully disclosed below, microprocessor/controller 15 calculates the complex self-immittance 80 of GE 5 from these synchronously acquired digital data samples.

The apparatus of FIG. 8 employs current excitation and voltage response and may therefore be considered as means for measuring components of complex self-impedance Z=R+jX. However, since the excitation signal will not be assumed to be a zero-phase reference, excitation and response are mathematically symmetrical. Accordingly, the FIG. 8 apparatus can also be considered means for determining components of complex self-admittance.

Figure 9:
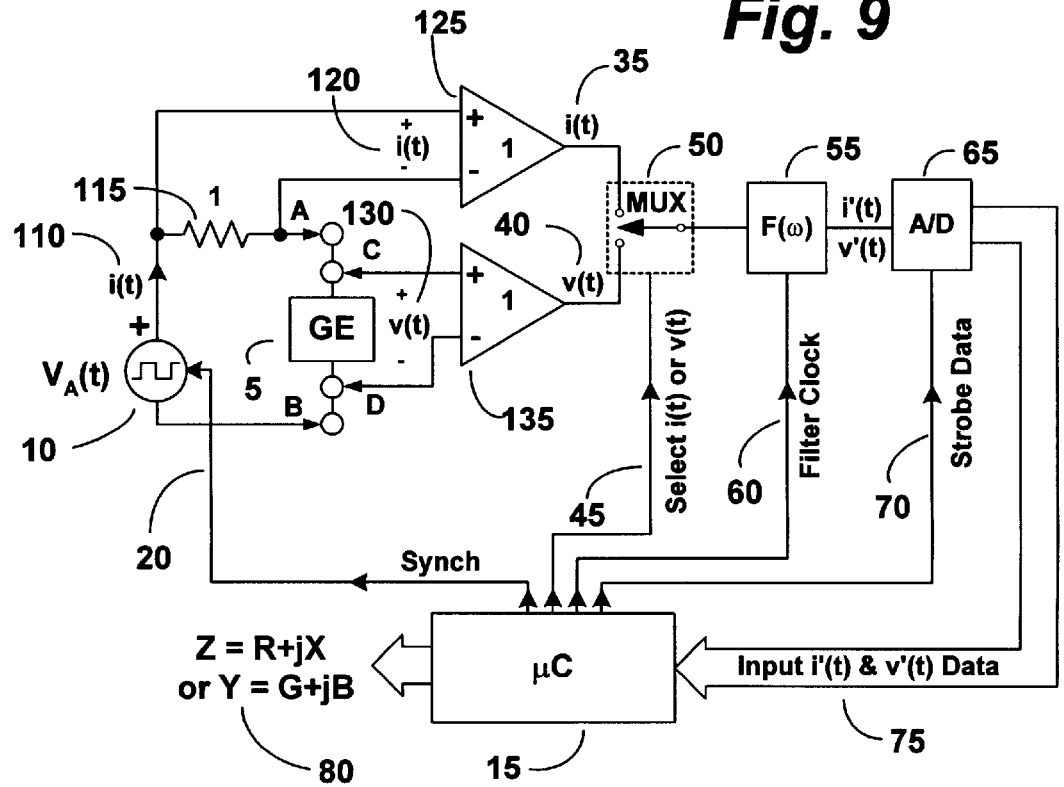
FIG. 9 is a block-diagram of a fourth embodiment of apparatus that is particularly appropriate for measuring complex self-immittance of a low-impedance element at a discrete measuring frequency in accordance with the present invention.

FIG. 9 discloses a modified form of the apparatus of FIG. 8 that is appropriate to accurately measuring complex self-immittance of a very low-impedance general element. The apparatus of FIG. 9 utilizes "four-point" or "Kelvin" connections to the unknown general element 5. Active excitation current i(t) passes through GE 5 via current-carrying contacts A and B. The resulting voltage response v(t) is sensed at separate voltage-sensing contacts C and D. By using separate contacts for applying active current excitation and for detecting voltage response, errors due to contact and lead-wire impedances are avoided. The apparatus of FIG. 9 is identical to that of FIG. 8 in all other respects.

The theory to be developed below will show that any dc terms in v(t) or i(t) are mathematically ignored when evaluating complex immittance with any of the embodiments depicted in FIG. 4, 6, 8, or 9. Thus, in principle, general element 5 could comprise an active element, such as an electrochemical cell/battery, as well as a passive element such as a combination of resistors, capacitors, and inductors. In practice, however, the intrinsic internal voltage of an active element may be large enough to saturate electronic circuitry. If that is indeed the case, the complex self-immittance of the active element can still be measured approximately by using circuitry disclosed in FIGS. 10 and 11 to make the active element passive.

Figure 10:
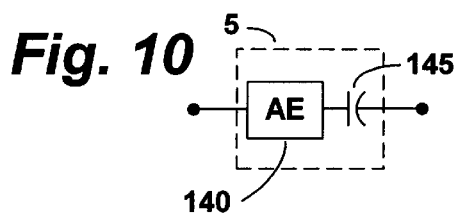
FIG. 10 depicts one method of modifying an active element, such as an electrochemical cell or battery, in order to approximate its self-immittance with the apparatus of FIG. 4, 6, 8, or 9.
Figure 11:
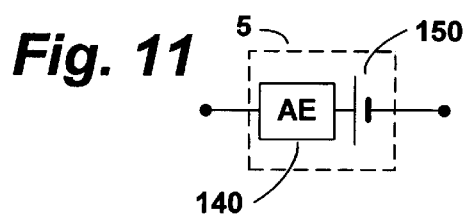
FIG. 11 depicts another method of modifying an active element, such as an electrochemical cell or battery, in order to approximate its self-immittance with the apparatus of FIG. 4, 6, 8, or 9.

FIG. 10 shows a general element 5 comprising an active element (AE) 140 containing an intrinsic dc source in series with a dc blocking capacitor 145. FIG. 11 shows a general element 5 comprising an active element (AE) 140 containing an intrinsic dc source in series with an appropriate dc blocking voltage or "potentiostat" 150. The circuits of FIGS. 10 and 11 both suppress the internal voltage of AE 140 and therefore serve to make the general element 5 a passive element. However, with both circuits, the additional series element, either 145 or 150, appears electrically as part of the measured element 5. Accordingly, the measurements are only approximations whose accuracy depends upon the relative size of the impedance of additional element 145 or 150 compared with the impedance of active element 140. Such measurement errors can be avoided, however, by using techniques in U.S. Pat. No. 6,002,238, U.S. patent application Ser. No. 09/454,629, and U.S. patent application Ser. No. 09/503,015 when measuring self-immittance of low-impedance active elements.

The theoretical basis for the measurements described above now follows. We will initially assume that a periodic voltage v(t) excites the unknown general element and that the response thereto is a periodic current i(t). However, for purposes of generality we will not assume either v(t) or i(t) to be a zero-phase reference signal. The initial treatment will therefore apply directly to determining Y=G+jB with any of the four embodiments disclosed in FIG. 4, 6, 8, or 9. In addition, by simply interchanging the roles of voltage and current, the initial results can be extended to determining Z=R+jX with any one of the same four embodiments.

Assume the excitation to be periodic with fundamental period T. The resulting band-limited periodic voltage and current signals, v'(t) and i'(t) can each be written as finite Fourier series $$v'(t) = V_0 + \sum_{k=1}^{k_{\max}} \{V_k^0 \sin(2\pi k f_1 t) + V_k^{90} \cos(2\pi k f_1 t)\} \quad (1)$$

and $$i'(t) = I_0 + \sum_{k=1}^{k_{\max}} \{I_k^0 \sin(2\pi k f_1 t) + I_k^{90} \cos(2\pi k f_1 t)\} \quad (2)$$

in which $f_1=1/T$ is the fundamental frequency of the excitation, $kf_1=f_k$ is the $k^{th}$ harmonic frequency, and $k_{max}$ is the index of the highest-order harmonic present in either of the two band-limited signals.

According to the well-known theory of Fourier analysis, the quantities $V_k^0$, $V_k^{90}$, $I_k^0$, $I_k^{90}$ are Fourier coefficients of v'(t) and i'(t). The four fundamental-frequency (k=1) coefficients are given by the integrals $$V_1^0 = \frac{2}{T}\int_0^T v'(t)\sin(2\pi f_1 t)dt \quad (3)$$

$$V_1^{90} = \frac{2}{T}\int_0^T v'(t)\cos(2\pi f_1 t)dt \quad (4)$$

$$I_1^0 = \frac{2}{T}\int_0^T i'(t)\sin(2\pi f_1 t)dt \quad (5)$$

$$I_1^{90} = \frac{2}{T}\int_0^T i'(t)\cos(2\pi f_1 t)dt \quad (6)$$

where the integration extends over one period of the excitation.

One sees from equations (1) and (2) that $V_1^0$, $V_1^{90}$, $I_1^0$, and $I_1^{90}$ represent amplitudes of voltage and current components at the fundamental frequency $f_1$ that are in time-phase (0°) and in time-quadrature (90°), respectively, with a reference zero-phase signal at this frequency. The timing of this reference signal, and hence the relative sizes of the in-phase and quadrature components, is determined by the point in the periodic excitation waveform that is chosen to be t=0 when evaluating integrals (3) through (6). However, as long as the same t=0 point is chosen for all four integrals, the choice of the t=0 point is completely arbitrary and has no effect upon the subsequent calculation of complex Y=G+jB. One sees further that equations (3) through (6) can be considered "sine/cosine correlation integrals" in which the interval of correlation is the fundamental period of the excitation waveform.

The four integrals, equations (3) through (6), can be evaluated in terms of discrete samples of v'(t) and i'(t) by using a numerical integration technique such as the trapezoidal rule. Assuming M equally spaced samples acquired over one fundamental period of the excitation T, the trapezoidal rule leads to $$V_1^0 = \frac{2}{M} \sum_{n=0}^{(M-1)} \left\{ v'\left(\frac{nT}{M}\right) \sin\left(\frac{2\pi n}{M}\right) \right\} \quad (7)$$

$$V_1^{90} = \frac{2}{M} \sum_{n=0}^{(M-1)} \left\{ v'\left(\frac{nT}{M}\right) \cos\left(\frac{2\pi n}{M}\right) \right\} \quad (8)$$

$$I_1^0 = \frac{2}{M} \sum_{n=0}^{(M-1)} \left\{ i'\left(\frac{nT}{M}\right) \sin\left(\frac{2\pi n}{M}\right) \right\} \quad (9)$$

$$I_1^{90} = \frac{2}{M} \sum_{n=0}^{(M-1)} \left\{ i'\left(\frac{nT}{M}\right) \cos\left(\frac{2\pi n}{M}\right) \right\} \quad (10)$$

Because of periodicity of the sine and cosine functions, any dc components of v'(t) and i'(t) cancel out of equations (7) through (10) and are therefore of no consequence.

The real and imaginary parts of the self-admittance Y=G+jB of GE 5 in FIGS. 4 and 6 follow by dividing fundamental-frequency complex current $I_1^0 + jI_1^{90}$ by fundamental-frequency complex voltage $V_1^0 + jV_1^{90}$ and rationalizing the quotient. The result is $$G = \left(\frac{1}{R_F}\right) \cdot \left(\frac{I_1^0 V_1^0 + I_1^{90} V_1^{90}}{(V_1^0)^2 + (V_1^{90})^2}\right) \quad (11)$$

and $$B = \left(\frac{1}{R_F}\right) \cdot \left(\frac{I_1^{90} V_1^0 - I_1^0 V_1^{90}}{(V_1^0)^2 + (V_1^{90})^2}\right) \quad (12)$$

where $R_F$ is the value of feedback resistor 30 in FIGS. 4 and 6 (which had been assumed to be unity for simplicity). For the embodiments of FIGS. 8 and 9, the comparable equations for G and B are $$G = \left(\frac{A_V}{R_V A_I}\right) \cdot \left(\frac{I_1^0 V_1^0 + I_1^{90} V_1^{90}}{(V_1^0)^2 + (V_1^{90})^2}\right) \quad (13)$$

and $$B = \left(\frac{A_V}{R_V A_I}\right) \cdot \left(\frac{I_1^{90} V_1^0 - I_1^0 V_1^{90}}{(V_1^0)^2 + (V_1^{90})^2}\right) \quad (14)$$

where $R_V$ is the value of "viewing" resistor 115, $A_I$ is the voltage gain of differential amplifier 125, and $A_V$ is the voltage gain of differential amplifier 135 (all three of which had been assumed to be unity for simplicity).

Note that the factor 2/M in equations (7) through (10) will cancel out of the evaluation of equations (11) through (14) so that only the summations need be considered. Note also that the choice of the t=0 sampling point affects the relative sizes of the in-phase and quadrature components determined from equations (7) through (10). However, as long as the same t=0 point is used for sampling both v'(t) and i'(t), the choice is arbitrary and has no effect upon the values of G and B determined from equations (11) through (14). The attenuation and phase shift of the filter response function, F(ω), likewise have no effect on the computed results since both v'(t) and i'(t) are processed identically by F(ω).

By simply interchanging the roles of voltage and current in equations (11) through (14), the equations can be extended to find the components of complex self-impedance Z=R+jX. The results are $$R = (R_F) \cdot \left(\frac{V_1^0 I_1^0 + V_1^{90} I_1^{90}}{(I_1^0)^2 + (I_1^{90})^2}\right) \quad (15)$$

$$X = (R_F) \cdot \left(\frac{V_1^{90} I_1^0 - V_1^0 I_1^{90}}{(I_1^0)^2 + (I_1^{90})^2}\right) \quad (16)$$

$$R = \left(\frac{R_V A_I}{A_V}\right) \cdot \left(\frac{V_1^0 I_1^0 + V_1^{90} I_1^{90}}{(I_1^0)^2 + (I_1^{90})^2}\right) \quad (17)$$

and $$X = \left(\frac{R_V A_I}{A_V}\right) \cdot \left(\frac{V_1^{90} I_1^0 - V_1^0 I_1^{90}}{(I_1^0)^2 + (I_1^{90})^2}\right) \quad (18)$$

Although numerical integration techniques are generally regarded to be approximations, my calculations prove that equations (7) through (10) are exact as long as the following criterion is satisfied:

$$M \geq k_{max} + 2 \quad (19)$$

where M is the number of evenly spaced samples acquired over one period T, and $k_{max}$ is the order of the highest-order harmonic present in the Fourier series representation of v'(t) and i'(t). As a consequence of equation (19), only three samples, spaced 120 degrees apart, are required to exactly evaluate Fourier coefficients of a pure sinusoid ($k_{max}$=1). However, if a Fourier series contains terms up to, say, the $8^{th}$ harmonic, at least 10 samples in one period are necessary to obtain exact evaluations of the fundamental-frequency Fourier coefficients.

When equation (19) is not satisfied, undersampling occurs and causes frequency "aliasing" errors. I have evaluated these errors by considering the effects of synchronous sampling upon signals that are not band-limited. These results can be summarized as follows:

$$V_1^0(\text{exact}) = V_1^0(M) + \sum_{n=1}^{\infty} \{V_{(nM-1)}^0 - V_{(nM+1)}^0\} \quad (20)$$

$$V_1^{90}(\text{exact}) = V_1^{90}(M) - \sum_{n=1}^{\infty} \{V_{(nM-1)}^{90} + V_{(nM+1)}^{90}\} \quad (21)$$

$$I_1^0(\text{exact}) = I_1^0(M) + \sum_{n=1}^{\infty} \{I_{(nM-1)}^0 - I_{(nM+1)}^0\} \quad (22)$$

$$I_1^{90}(\text{exact}) = I_1^{90}(M) - \sum_{n=1}^{\infty} \{I_{(nM-1)}^{90} + I_{(nM+1)}^{90}\} \quad (23)$$

where $V_1^0$(exact), $V_1^{90}$(exact), $I_1^0$(exact), $I_1^{90}$(exact), are the correct (exact) values of the fundamental-frequency Fourier coefficients, and $V_1^0$(M), $V_1^{90}$(M), $I_1^0$(M), $I_1^{90}$(M) are values calculated from equations (7) through (10) using M samples acquired over one period. Accordingly, the summations on the right-hand sides of equations (20) through (23) represent undersampling errors. With rapidly converging Fourier series, only the first term in each of these summations (k=M-1) is significant. One sees that, in complete agreement with equation (19), the presence of the $2^{nd}$ harmonic term will cause errors in determining fundamental-frequency Fourier coefficients with M=3. However, with M=10, the lowest-order harmonic term to cause such errors is the $9^{th}$ harmonic.

In principle, the fundamental-frequency Fourier coefficients of signals that are appropriately band-limited can be evaluated exactly from M evenly spaced samples acquired over only a single period. However, measurements made in the presence of electrical noise may contain noise-induced random errors. Fortunately, noise signals that are not correlated with $\sin(2\pi f_1 t)$ and $\cos(2\pi f_1 t)$ will, on average, make equal positive and negative contributions to the correlation integrals. Thus, their effects can be removed by averaging over multiple periods. Consider averaging the four fundamental-frequency Fourier coefficients over N periods, where N is an integer. The results are written $$\langle V_1^0 \rangle_{av} = \frac{2}{NT} \int_0^{NT} v'(t) \sin(2\pi f_1 t) dt \tag{24}$$

$$\langle V_1^{90} \rangle_{av} = \frac{2}{NT} \int_0^{NT} v'(t) \cos(2\pi f_1 t) dt \tag{25}$$

$$\langle I_1^0 \rangle_{av} = \frac{2}{NT} \int_0^{NT} i'(t) \sin(2\pi f_1 t) dt \tag{26}$$

$$\langle I_1^{90} \rangle_{av} = \frac{2}{NT} \int_0^{NT} i'(t) \cos(2\pi f_1 t) dt \tag{27}$$

Note that averaging the Fourier coefficients over N periods effectively extends the interval of correlation of the correlation integrals to NT.

Since the numerical evaluations disclosed in equations (7)–(10) express linear relationships, the order of averaging and of summing can be interchanged. That is, the average of the sum is equal to the sum of the averages:

$$\langle V_1^0 \rangle_{av} = \left\langle v'(0)\sin(0) + v'\left(\frac{T}{M}\right)\sin\left(\frac{2\pi}{M}\right) + \right. \tag{28}$$
$$\left. v'\left(\frac{2T}{M}\right)\sin\left(\frac{4\pi}{M}\right) + \ldots \right\rangle_{av}$$
$$= \langle v'(0) \rangle_{av} \sin(0) + \left\langle v'\left(\frac{T}{M}\right) \right\rangle_{av} \sin\left(\frac{2\pi}{M}\right) +$$
$$\left\langle v'\left(\frac{2T}{M}\right) \right\rangle_{av} \sin\left(\frac{4\pi}{M}\right) + \ldots$$

with similar results applying to $(V_1^{90})_{av}$, $(I_1^0)_{av}$, and $(I_1^{90})_{av}$. Accordingly, the time-averaged Fourier coefficients can be conveniently evaluated by simply averaging the sampled values themselves over N periods and then applying the trapezoidal rule to the time-averaged data samples. The N-period sample-averages can be written $$\left\langle v'\left(\frac{nT}{M}\right) \right\rangle_{av} = \frac{1}{N} \sum_{p=0}^{(N-1)} v'\left(\frac{nT}{M} + pT\right) \tag{29}$$

$$\left\langle i'\left(\frac{nT}{M}\right) \right\rangle_{av} = \frac{1}{N} \sum_{p=0}^{(N-1)} i'\left(\frac{nT}{M} + pT\right) \tag{30}$$

Applying the trapezoidal rule to these averages leads to $$\langle V_1^0 \rangle_{av} = \frac{2}{M} \sum_{n=0}^{(M-1)} \left\{ \left\langle v'\left(\frac{nT}{M}\right) \right\rangle_{av} \sin\left(\frac{2\pi n}{M}\right) \right\} \tag{31}$$

$$\langle V_1^{90} \rangle_{av} = \frac{2}{M} \sum_{n=0}^{(M-1)} \left\{ \left\langle v'\left(\frac{nT}{M}\right) \right\rangle_{av} \cos\left(\frac{2\pi n}{M}\right) \right\} \tag{32}$$

$$\langle I_1^0 \rangle_{av} = \frac{2}{M} \sum_{n=0}^{(M-1)} \left\{ \left\langle i'\left(\frac{nT}{M}\right) \right\rangle_{av} \sin\left(\frac{2\pi n}{M}\right) \right\} \tag{33}$$

$$\langle I_1^{90} \rangle_{av} = \frac{2}{M} \sum_{n=0}^{(M-1)} \left\{ \left\langle i'\left(\frac{nT}{M}\right) \right\rangle_{av} \cos\left(\frac{2\pi n}{M}\right) \right\} \tag{34}$$

where M is number of samples acquired in a single period. Finally, real and imaginary parts of the GE complex self-admittance for the embodiments of FIGS. 4 and 6 follow by dividing the time-averaged fundamental-frequency complex current $(I_1^0)_{av} + j(I_1^{90})_{av}$ by the time-averaged fundamental-frequency complex voltage $(V_1^0)_{av} + j(V_1^{90})_{av}$ and rationalizing the quotient. The result is $$G = \left(\frac{1}{R_F}\right) \cdot \left(\frac{\langle I_1^0 \rangle_{av} \langle V_1^0 \rangle_{av} + \langle I_1^{90} \rangle_{av} \langle V_1^{90} \rangle_{av}}{\langle V_1^0 \rangle_{av}^2 + \langle V_1^{90} \rangle_{av}^2}\right) \tag{35}$$

and $$B = \left(\frac{1}{R_F}\right) \cdot \left(\frac{\langle I_1^{90} \rangle_{av} \langle V_1^0 \rangle_{av} - \langle I_1^0 \rangle_{av} \langle V_1^{90} \rangle_{av}}{\langle V_1^0 \rangle_{av}^2 + \langle V_1^{90} \rangle_{av}^2}\right) \tag{36}$$

while for the embodiments of FIGS. 8 and 9

$$G = \left(\frac{A_V}{R_V A_I}\right) \cdot \left(\frac{\langle I_1^0 \rangle_{av} \langle V_1^0 \rangle_{av} + \langle I_1^{90} \rangle_{av} \langle V_1^{90} \rangle_{av}}{\langle V_1^0 \rangle_{av}^2 + \langle V_1^{90} \rangle_{av}^2}\right) \tag{37}$$

and $$B = \left(\frac{A_V}{R_V A_I}\right) \cdot \left(\frac{\langle I_1^{90} \rangle_{av} \langle V_1^0 \rangle_{av} - \langle I_1^0 \rangle_{av} \langle V_1^{90} \rangle_{av}}{\langle V_1^0 \rangle_{av}^2 + \langle V_1^{90} \rangle_{av}^2}\right) \tag{38}$$

Interchanging the roles of voltage and current in equations (35) through (38) to determine the components of complex self-impedance $Z = R + jX$ leads to $$R = (R_F) \cdot \left(\frac{\langle V_1^0 \rangle_{av} \langle I_1^0 \rangle_{av} + \langle V_1^{90} \rangle_{av} \langle I_1^{90} \rangle_{av}}{\langle I_1^0 \rangle_{av}^2 + \langle I_1^{90} \rangle_{av}^2}\right) \tag{39}$$

$$X = (R_F) \cdot \left(\frac{\langle V_1^{90} \rangle_{av} \langle I_1^0 \rangle_{av} - \langle V_1^0 \rangle_{av} \langle I_1^{90} \rangle_{av}}{\langle I_1^0 \rangle_{av}^2 + \langle I_1^{90} \rangle_{av}^2}\right) \tag{40}$$

$$R = \left(\frac{R_V A_I}{A_V}\right) \cdot \left(\frac{\langle V_1^0 \rangle_{av} \langle I_1^0 \rangle_{av} + \langle V_1^{90} \rangle_{av} \langle I_1^{90} \rangle_{av}}{\langle I_1^0 \rangle_{av}^2 + \langle I_1^{90} \rangle_{av}^2}\right) \tag{41}$$

and $$X = \left(\frac{R_V A_I}{A_V}\right) \cdot \left(\frac{\langle V_1^{90} \rangle_{av} \langle I_1^0 \rangle_{av} - \langle V_1^0 \rangle_{av} \langle I_1^{90} \rangle_{av}}{\langle I_1^0 \rangle_{av}^2 + \langle I_1^{90} \rangle_{av}^2}\right) \tag{42}$$

Note that the common factors $1/N$ in equations (29) and (30) and $2/M$ in equations (31)–(34) will cancel out of the evaluations of equations (35)–(42). Accordingly, only the summations themselves in equations (29)–(34) need be considered.

The combination of synchronously acquiring M samples/period, averaging (or summing) over N periods, and numerically evaluating fundamental-frequency Fourier coefficients leads to a pronounced digital-filtering action that effectively suppresses noise by strongly favoring signals at exactly the synchronous (excitation) frequency. These results are illustrated in the theoretical plots of FIGS. 12–17. The plots of FIGS. 12–17 all assume the synchronous frequency to be 5 Hz and investigate the effect of varying the frequency of an assumed sinusoidal input signal.

Figure 12:
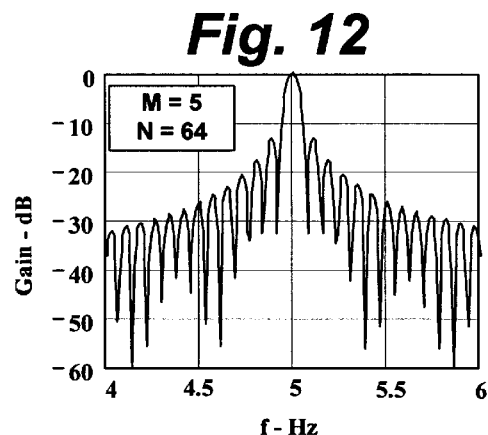
FIG. 12 is a linear-frequency plot of normalized Fourier coefficient magnitude in dB calculated from sampled sinusoidal data acquired at the rate of 5 samples per synchronous period and averaged or summed over 64 synchronous periods.
Figure 13:
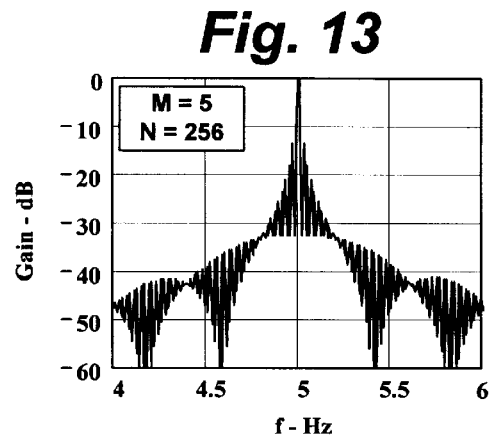
FIG. 13 is a linear-frequency plot of normalized Fourier coefficient magnitude in dB calculated from sampled sinusoidal data acquired at the rate of 5 samples per synchronous period and averaged or summed over 256 synchronous periods.

FIG. 12 shows that with M=5 samples per period averaged or summed over N=64 periods, signals only 1 Hz from the synchronous frequency are attenuated by more than 30 decibels. FIG. 13 shows a comparable plot for signals that have been averaged or summed over N=256 periods. One sees that the attenuation 1 Hz from the synchronous frequency has been increased to 48 decibels by this increase in the correlation interval.

Figure 14:
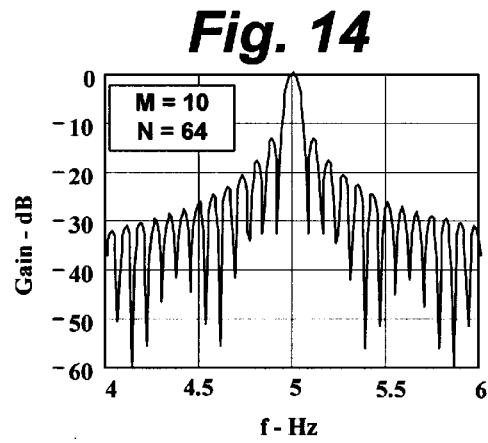
FIG. 14 is a linear-frequency plot of normalized Fourier coefficient magnitude in dB calculated from sampled sinusoidal data acquired at the rate of 10 samples per synchronous period and averaged or summed over 64 synchronous periods.
Figure 15:
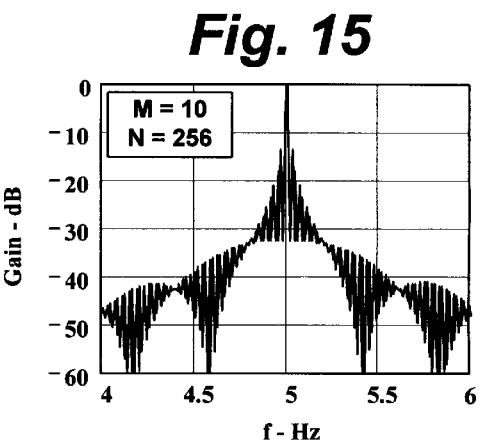
FIG. 15 is a linear-frequency plot of normalized Fourier coefficient magnitude in dB calculated from sampled sinusoidal data acquired at the rate of 10 samples per synchronous period and averaged or summed over 256 synchronous periods.

FIGS. 14 and 15 show comparable plots with M increased to 10 samples per period. This increase in M is seen to have no observable effect throughout the frequency range from 4 to 6 Hz. Such a result is consistent with the discussion above regarding equations (19) through (23). That discussion concludes that the value of M primarily affects frequency "aliasing" of the synchronous input signal. Such effects can only be observed at frequencies that are harmonics of the synchronous frequency.

Figure 16:
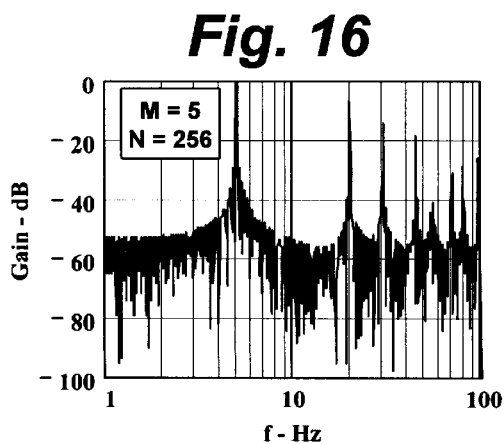
FIG. 16 is a logarithmic-frequency plot of normalized Fourier coefficient magnitude in dB calculated from sampled sinusoidal data acquired at the rate of 5 samples per synchronous period and averaged or summed over 256 synchronous periods.
Figure 17:
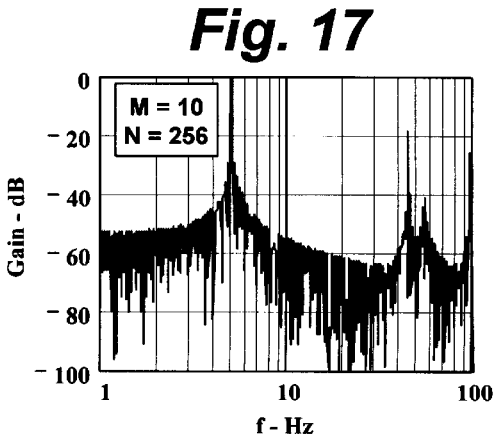
FIG. 17 is a logarithmic-frequency plot of normalized Fourier coefficient magnitude in dB calculated from sampled sinusoidal data acquired at the rate of 10 samples per synchronous period and averaged or summed over 256 synchronous periods.

FIGS. 16 and 17 illustrate the influence of the number of samples per period M on the harmonic response at frequencies up to 100 Hz. FIG. 16 shows that with M=5, there are observable harmonic response "peaks" at 20 Hz ($4^{th}$ harmonic), 30 Hz ($6^{th}$ harmonic), 45 Hz ($9^{th}$ harmonic), 55 Hz ($11^{th}$ harmonic), 70 Hz ($14^{th}$ harmonic), 80 Hz ($16^{th}$ harmonic), and 95 Hz ($19^{th}$ harmonic). However, with M=10, (FIG. 17) the only response "peaks" observed are at the $9^{th}$, $11^{th}$, and $19^{th}$ harmonic frequencies. These results agree exactly with predictions based upon equations (20) through (23). Band-limiting filter $F(\omega)$ serves primarily to ensure that all of the harmonic components of v'(t) and i'(t) are negligible at such response frequencies.

This completes the disclosure of my invention. The invention is extremely accurate and is relatively inexpensive to implement. In summary, the steps leading to the evaluation of components of complex self-impedance/admittance of a general electrical element at a discrete measuring frequency in accordance with my invention include one or more of the following:

Exciting the general element with a source of periodic voltage or current that has a fundamental period equal to the reciprocal of the measuring frequency.

Sensing a time-varying signal proportional to the periodic voltage or current excitation, and a second time-varying signal proportional to the general element's periodic current or voltage response.

Processing both signals with identical low-pass or band-pass filter-response functions to provide band-limited excitation and response signals.

Sampling the band-limited excitation and response signals in synchronism with the excitation waveform at three or more equally spaced times over a period and over one or more consecutive periods.

Converting the data samples to digital format.

Averaging or summing the individual digital samples over one or more periods (equations (29) and (30)).

Multiplying the averaged or summed data by appropriate sine/cosine values and summing the results to numerically evaluate sine/cosine correlation integrals (equations (31)–(34)).

Numerically combining the values of the sine/cosine correlation integrals to obtain the components of complex self-impedance/admittance of the general electrical element (equations (35)–(42)).

The disclosed invention is quite immune to electrical noise and can measure general electrical elements that are actually in use in electrical circuits. Its inherent noise immunity results from two different factors. First, placing identical band-limiting filters in the i(t) and v(t) signal paths attenuates noise before the signals are sampled. Second, averaging or summing the synchronously acquired digital samples over multiple periods provides an additional digital filtering effect that further attenuates noise signals not correlated with $\sin(2\pi f_1 t)$ and $\cos(2\pi f_1 t)$. Either one of these two techniques could be employed separately without departing from the true spirit and scope of my invention.

For example, in low-noise situations, one could sample v'(t) and i'(t) over only one period. Similarly, if higher-order harmonics of the excitation and response waveforms were sufficiently small, one could leave out the band-limiting filters and rely solely upon synchronous-sampling/averaging to suppress noise. Finally, with both low-noise and small harmonics, both the band-limiting filters and averaging/summing over multiple periods could be dispensed with. These variations all fall within the purview of my invention.

Furthermore, one could express complex immittance in terms of magnitude and phase rather than real and imaginary parts, or could utilize my invention to evaluate only one of the two components of complex immittance. One could also use different values of M or N for the current signal than for the voltage signal and could interchange the order of numerical integration and averaging (see equation (28)). Also, excitation and response signals having half-period symmetry need only be sampled during alternate half-periods rather than over full-period intervals. Finally, rather than a single multiplexed band-limiting filter, one could use separate filters in the i'(t) and v'(t) signal paths, provided that the two filters are sufficiently well matched. Workers skilled in the art will recognize that these and other variations may be made in form and detail without departing from the true spirit and scope of my invention. For example, specific frequencies, harmonics, specifics set forth herein can be modified in accordance with the invention. The actual elements used to implement the invention can be embodied in hardware, software, or their combination. The various elements set forth in the figures, for example, can be implemented using hardware and software components.

What is claimed is:

1. Apparatus for evaluating at least one component of complex self-immittance of an electrical element at a discrete frequency comprising:

excitation circuitry adapted to excite said element with periodic excitation characterized by a fundamental period equal to the reciprocal of said discrete frequency;

excitation signal sense and process circuitry adapted to provide an excitation signal in accordance with said periodic excitation;

response signal sense and process circuitry adapted to provide a response signal in accordance with a periodic response of said electrical element to said periodic excitation;

excitation signal sample and convert circuitry adapted to provide digital representations of sampled values of said excitation signal, said sampled values acquired at discrete excitation signal sampling times synchronized with said periodic excitation and distributed in time over one or more half-period or full-period intervals of said fundamental period;

response signal sample and convert circuitry adapted to provide digital representations of sampled values of said response signal, said sampled values acquired at discrete response signal sampling times synchronized with said periodic excitation and distributed in time over one or more half-period or full-period intervals of said fundamental period; and, computation and control circuitry adapted to initiate said excitation signal sampling times, to initiate said response signal sampling times, and to numerically combine said digital representations of said sampled values of said excitation signal and said digital representations of said sampled values of said response signal to evaluate at least one said component of said complex self-immittance of said electrical element at said discrete frequency.

2. Apparatus as in claim 1 wherein said periodic excitation is a periodic voltage excitation and said periodic response is a periodic current response.

3. Apparatus as in claim 2 wherein said response signal sense and process circuitry includes an operational amplifier configured as a current-to-voltage converter.

4. Apparatus as in claim 1 wherein said periodic excitation is a periodic current excitation and said periodic response is a periodic voltage response.

5. Apparatus as in claim 4 wherein said excitation signal sense and process circuitry includes a viewing resistor connected in series with said electrical element.

6. Apparatus as in claim 4 including separate contacts to said element for applying said periodic current excitation and for sensing said periodic voltage response.

7. Apparatus as in claim 1 wherein said excitation signal sense and process circuitry and said response signal sense and process circuitry include filtering circuitry adapted to process both said excitation signal and said response signal with identical filter response functions.

8. Apparatus as in claim 7 wherein said filter response functions are low-pass filter response functions.

9. Apparatus as in claim 7 wherein said filter response functions are band-pass filter response functions.

10. Apparatus as in claim 1 wherein said computation and control circuitry is further adapted to initiate the timing of said periodic excitation and to identify said excitation signal sampling times and said response signal sampling times by measuring from a periodically repeating timing point of said periodic excitation.

11. Apparatus as in claim 10 wherein said excitation circuitry includes a voltage source and a controlled switch and said computation and control circuitry initiates said timing of said periodic excitation by periodically turning said controlled switch on and off thereby periodically interrupting a current through said voltage source.

12. Apparatus as in claim 1 wherein said excitation circuitry includes waveform generating and timing circuitry adapted to spontaneously generate said periodic excitation and to communicate synchronous periodic timing pulses to said computation and control circuitry, said computation and control circuitry being adapted to identify said excitation signal sampling times and said response signal sampling times by measuring from said timing pulses.

13. Apparatus as in claim 1 wherein said periodic excitation is a periodic square wave excitation.

14. Apparatus as in claim 1 wherein said periodic excitation is a periodic sine wave excitation.

15. Apparatus as in claim 1 wherein said computation and control circuitry is further adapted to average or sum said digital representations of said sampled values of said excitation signal over one or more periods to obtain time-averaged excitation results, to average or sum said digital representations of said sampled values of said response signal over one or more periods to obtain time-averaged response results, to numerically combine said time-averaged excitation results with appropriate sine and cosine values to evaluate excitation sine and cosine correlation integrals, to numerically combine said time-averaged response results with appropriate sine and cosine values to evaluate response sine and cosine correlation integrals, and to numerically combine said excitation sine and cosine correlation integrals and said response sine and cosine correlation integrals to evaluate at least one component of said complex self-immittance of said electrical element at said discrete frequency.

16. Apparatus as in claim 1 wherein said electrical element comprises an active electrical element and a dc blocking capacitor in series.

17. Apparatus as in claim 1 wherein said electrical element comprises an active electrical element and a dc blocking voltage in series.

18. Apparatus for evaluating at least one component of complex self-immittance of an electrical element at a discrete frequency comprising:

excitation circuitry adapted to excite said element with periodic excitation characterized by a fundamental period equal to the reciprocal of said discrete frequency;

excitation signal sense circuitry adapted to provide an excitation signal in accordance with said periodic excitation;

response signal sense circuitry adapted to provide a response signal in accordance with a periodic response of said electrical element to said periodic excitation;

filter circuitry characterized by a frequency response characteristic and adapted to provide a band-limited excitation signal in accordance with said frequency response characteristic and a band-limited response signal in accordance with the same said frequency response characteristic; and, evaluate circuitry adapted to provide values of at least one said component of said complex self-immittance of said electrical element at said discrete frequency in accordance with said band-limited excitation signal and said band-limited response signal.

19. Apparatus as in claim 18 wherein said evaluate circuitry comprises:

sample and convert circuitry adapted to provide digital representations of sampled values of said band-limited excitation signal and of said band-limited response signal, said sampled values obtained at periodically repeating sample times synchronized to said periodic excitation and distributed in time over at least one half-period or full-period interval of said fundamental period of said periodic excitation; and, computation and control circuitry adapted to initiate said sample times and to compute at least one said component of said complex self-immittance of said electrical element at said discrete frequency from said digital representations of said sampled values of said band-limited excitation signal and said band-limited response signal.

20. Apparatus as in claim 19 wherein said computation and control circuitry is further adapted to initiate the timing of said periodic excitation and to identify said sample times by measuring from a periodically repeating timing point of said periodic excitation.

21. Apparatus as in claim 20 wherein said excitation circuitry includes a controlled switch and a voltage source, and said computation and control circuitry initiates said timing of said periodic excitation by periodically turning said controlled switch on and off thereby periodically interrupting a current through said voltage source.

22. Apparatus as in claim 19 wherein said excitation circuitry includes waveform generating and timing circuitry adapted to spontaneously generate said periodic excitation and to communicate periodic timing pulses to said computation and control circuitry in synchronism with said periodic excitation, said computation and control circuitry being adapted to identify said sample times by measuring from said periodic timing pulses.

23. Apparatus as in claim 18 wherein said periodic excitation is a periodic voltage excitation and said periodic response is a periodic current response.

24. Apparatus as in claim 23 wherein said response signal sense circuitry includes an operational amplifier configured as a current-to-voltage converter.

25. Apparatus as in claim 18 wherein said periodic excitation is a periodic current excitation and said periodic response is a periodic voltage response.

26. Apparatus as in claim 25 wherein said excitation signal sense circuitry includes a viewing resistor connected in series with said electrical element.

27. Apparatus as in claim 25 including separate contacts to said element for applying said periodic current excitation and for sensing said periodic voltage response.

28. Apparatus as in claim 18 wherein said frequency response characteristic is a low-pass frequency response characteristic.

29. Apparatus as in claim 18 wherein said frequency response characteristic is a band-pass frequency response characteristic.

30. Apparatus as in claim 18 wherein said filter circuitry comprises a pair of matched filter circuits adapted to separately provide said band-limited excitation signal and said band-limited response signal.

31. Apparatus as in claim 18 wherein said filter circuitry comprises a single filter circuit adapted to provide both said band-limited excitation signal and said band-limited response signal.

32. Apparatus as in claim 18 wherein said periodic excitation is a periodic square wave excitation.

33. Apparatus as in claim 18 wherein said periodic excitation is a periodic sine wave excitation.

34. Apparatus as in claim 19 wherein said computation and control circuitry is further adapted to average or sum said digital representations of said sampled values of said band-limited excitation signal over one or more periods to obtain time-averaged excitation results, to average or sum said digital representations of said sampled values of said band-limited response signal over one or more periods to obtain time-averaged response results, to numerically combine said time-averaged excitation results with appropriate sine and cosine values to evaluate excitation sine and cosine correlation integrals, to numerically combine said time-averaged response results with appropriate sine and cosine values to evaluate response sine and cosine correlation integrals, and to numerically combine said excitation sine and cosine correlation integrals and said response sine and cosine correlation integrals to evaluate at least one component of said complex self-immittance of said electrical element at said discrete frequency.

35. Apparatus as in claim 18 wherein said electrical element comprises an active electrical element and a dc blocking capacitor in series.

36. Apparatus as in claim 18 wherein said electrical element comprises an active electrical element and a dc blocking voltage in series.

37. A method for determining at least one component of complex self-immittance of an electrical element at a discrete frequency comprising:

exciting said electrical element with periodic time-varying excitation characterized by a fundamental period equal to the reciprocal of said discrete frequency;

sensing an excitation signal proportional to said periodic time-varying excitation and a response signal proportional to a periodic time-varying response of said electrical element to said periodic time-varying excitation;

processing said excitation signal and said response signal with identical frequency response functions to obtain a band-limited excitation signal and a band-limited response signal; and, combining said band-limited excitation signal and said band-limited response signal to determine at least one said component of said complex self-immittance of said electrical element at said discrete frequency.

38. A method as in claim 37 wherein combining said band-limited excitation signal and said band-limited response signal further comprises:

sampling said band-limited excitation signal and said band-limited response signal at sampling times synchronized to said periodic time-varying excitation to obtain data samples and converting said data samples to digital format; and, computing at least one said component of said complex self-immittance of said electrical element at said discrete frequency from said data samples converted to said digital format.

39. A method according to claim 38 wherein computing further comprises:

time-averaging said data samples converted to digital format over one or more periods to obtain time-averaged digital samples;

evaluating sine and cosine correlation integrals from said time-averaged digital samples; and, combining said sine and cosine correlation integrals numerically to determine at least one said component of said complex self-immittance of said electrical element at said discrete frequency.

40. A method as in claim 37 wherein exciting said electrical element with said periodic time-varying excitation comprises exciting said electrical element with periodic square-wave excitation.

41. A method as in claim 37 wherein exciting said electrical element with said periodic time-varying excitation comprises exciting said electrical element with periodic sinusoidal excitation.

42. A method according to claim 37 wherein processing said excitation signal and said response signal with identical frequency response functions comprises processing said excitation signal and said response signal with identical low-pass frequency response functions.

43. A method according to claim 37 wherein processing said excitation signal and said response signal with identical frequency response functions comprises processing said excitation signal and said response signal with identical band-pass frequency response functions.

44. A method as in claim 37 wherein said periodic time-varying excitation is a periodic time-varying voltage excitation and said periodic time-varying response is a periodic time-varying current response.

45. A method as in claim 37 wherein said periodic time-varying excitation is a periodic time-varying current excitation and said periodic time-varying response is a periodic time-varying voltage response.

46. A method as in claim 37 wherein said electrical element comprises an active electrical element and a dc blocking capacitor in series.

47. A method as in claim 37 wherein said electrical element comprises an active electrical element and a dc blocking voltage in series.

48. A method for determining at least one component of complex self-immittance of an electrical element at a discrete frequency comprising:
   exciting said electrical element with periodic time-varying excitation characterized by a fundamental period equal to the reciprocal of said discrete frequency;
   forming an excitation signal in accordance with said periodic time-varying excitation and a response signal in accordance with a time-varying response of said electrical element to said periodic time-varying excitation;
   sampling said excitation signal and said response signal at times synchronized with said periodic time-varying excitation and distributed over one or more half-period or full-period intervals of said periodic time-varying excitation, and converting sampled values to digital format;
   time-averaging said sampled values over one or more periods to obtain time-averaged sampled values;
   evaluating sine and cosine correlation integrals from said time-averaged sample values; and,
   numerically combining said sine and cosine correlation integrals to determine at least one said component of said complex self-immittance of said electrical element at said discrete frequency.

49. A method as in claim 48 wherein forming said excitation signal and said response signal includes processing said excitation signal and said response signal with identical low-pass frequency response functions.

50. A method as in claim 48 wherein forming said excitation signal and said response signal includes processing said excitation signal and said response signal with identical band-pass frequency response functions.

51. A method as in claim 48 wherein exciting said electrical element with periodic time-varying excitation comprises exciting said electrical element with periodic time-varying square-wave excitation.

52. A method as in claim 48 wherein exciting said electrical element with periodic time-varying excitation comprises exciting said electrical element with periodic time-varying sinusoidal excitation.

53. A method as in claim 48 wherein said periodic time-varying excitation is a periodic time-varying voltage excitation and said periodic time-varying response is a periodic time-varying current response.

54. A method as in claim 48 wherein said periodic time-varying excitation is a periodic time-varying current excitation and said periodic time-varying response is a periodic time-varying voltage response.

55. A method as in claim 48 wherein said electrical element comprises an active electrical element and a dc blocking capacitor in series.

56. A method as in claim 48 wherein said electrical element comprises an active electrical element and a dc blocking voltage in series.

57. Apparatus for determining at least one component of complex self-immittance of an electrical element at a discrete frequency adapted for performing the steps according to claim 37.

58. Apparatus for determining at least one component of complex self-immittance of an electrical element at a discrete frequency adapted for performing the steps according to claim 48.

59. Apparatus for evaluating at least one component of complex self-immittance of an electrical element at a discrete frequency comprising:
   excitation circuitry adapted to excite said element with periodic excitation characterized by a fundamental period equal to the reciprocal of said discrete frequency;
   an excitation signal related to said periodic excitation;
   a response signal related to a periodic response of said electrical element to said periodic excitation;
   digital representations of sampled values of said excitation signal, said sampled values acquired at discrete excitation signal sampling times synchronized with said periodic excitation and distributed in time over one or more half-period or full-period intervals of said fundamental period;
   digital representations of sampled values of said response signal, said sampled values acquired at discrete response signal sampling times synchronized with said periodic excitation and distributed in time over one or more half-period or full-period intervals of said fundamental period; and,
   computation and control circuitry adapted to initiate said excitation signal sampling times, to initiate said response signal sampling times, and to numerically combine said digital representations of said sampled values of said excitation signal and said digital representations of said sampled values of said response signal to evaluate at least one said component of said complex self-immittance of said electrical element at said discrete frequency.

60. Apparatus as in claim 59 wherein said periodic excitation is a periodic voltage excitation and said periodic response is a periodic current response.

61. Apparatus as in claim 60 including an operational amplifier configured as a current-to-voltage converter.

62. Apparatus as in claim 59 wherein said periodic excitation is a periodic current excitation and said periodic response is a periodic voltage response.

63. Apparatus as in claim 62 including a viewing resistor connected in series with said electrical element.

64. Apparatus as in claim 62 including separate contacts to said element for applying said periodic current excitation and for sensing said periodic voltage response.

65. Apparatus as in claim 59 including filtering circuitry adapted to process both said excitation signal and said response signal with identical filter response functions.

66. Apparatus as in claim 65 wherein said filter response functions are low-pass filter response functions.

67. Apparatus as in claim 65 wherein said filter response functions are band-pass filter response functions.

68. Apparatus as in claim 59 wherein said computation and control circuitry is further adapted to initiate the timing of said periodic excitation and to identify said excitation signal sampling times and said response signal sampling times by measuring from a periodically repeating timing point of said periodic excitation.

69. Apparatus as in claim 68 wherein said excitation circuitry includes a voltage source and a controlled switch and said computation and control circuitry initiates said timing of said periodic excitation by periodically turning said controlled switch on and off thereby periodically interrupting a current through said voltage source.

70. Apparatus as in claim 59 wherein said excitation circuitry includes waveform generating and timing circuitry adapted to spontaneously generate said periodic excitation and to communicate synchronous periodic timing pulses to said computation and control circuitry, said computation and control circuitry being adapted to identify said excitation signal sampling times and said response signal sampling times by measuring from said timing pulses.

71. Apparatus as in claim 59 wherein said periodic excitation is a periodic square wave excitation.

72. Apparatus as in claim 59 wherein said periodic excitation is a periodic sine wave excitation.

73. Apparatus as in claim 59 wherein said computation and control circuitry is further adapted to average or sum said digital representations of said sampled values of said excitation signal over one or more periods to obtain time-averaged excitation results, to average or sum said digital representations of said sampled values of said response signal over one or more periods to obtain time-averaged response results, to numerically combine said time-averaged excitation results with appropriate sine and cosine values to evaluate excitation sine and cosine correlation integrals, to numerically combine said time-averaged response results with appropriate sine and cosine values to evaluate response sine and cosine correlation integrals, and to numerically combine said excitation sine and cosine correlation integrals and said response sine and cosine correlation integrals to evaluate at least one component of said complex self-immittance of said electrical element at said discrete frequency.

74. Apparatus as in claim 59 wherein said electrical element comprises an active electrical element and a dc blocking capacitor in series.

75. Apparatus as in claim 59 wherein said electrical element comprises an active electrical element and a dc blocking voltage in series.

76. Apparatus for evaluating at least one component of complex self-immittance of an electrical element at a discrete frequency comprising:
   excitation circuitry adapted to excite said element with periodic excitation characterized by a fundamental period equal to the reciprocal of said discrete frequency;
   an excitation signal related to said periodic excitation;
   a response signal related to a periodic response of said electrical element to said periodic excitation;
   a band-limited excitation signal related to said excitation signal and to a frequency response characteristic
   a band-limited response signal related to said response signal and to said frequency response characteristic; and,
   evaluate circuitry adapted to provide values of at least one said component of said complex self-immittance of said electrical element at said discrete frequency in accordance with said band-limited excitation signal and said band-limited response signal.

77. Apparatus as in claim 76 wherein said evaluate circuitry comprises:
   sample and convert circuitry adapted to provide digital representations of sampled values of said band-limited excitation signal and of said band-limited response signal, said sampled values obtained at periodically repeating sample times synchronized to said periodic excitation and distributed in time over at least one half-period or full-period interval of said fundamental period of said periodic excitation; and,
   computation and control circuitry adapted to initiate said sample times and to compute at least one said component of said complex self-immittance of said electrical element at said discrete frequency from said digital representations of said sampled values of said band-limited excitation signal and said band-limited response signal.

78. Apparatus as in claim 77 wherein said computation and control circuitry is further adapted to initiate the timing of said periodic excitation and to identify said sample times by measuring from a periodically repeating timing point of said periodic excitation.

79. Apparatus as in claim 78 wherein said excitation circuitry includes a controlled switch and a voltage source, and said computation and control circuitry initiates said timing of said periodic excitation by periodically turning said controlled switch on and off thereby periodically interrupting a current through said voltage source.

80. Apparatus as in claim 77 wherein said excitation circuitry includes waveform generating and timing circuitry adapted to spontaneously generate said periodic excitation and to communicate periodic timing pulses to said computation and control circuitry in synchronism with said periodic excitation, said computation and control circuitry being adapted to identify said sample times by measuring from said periodic timing pulses.

81. Apparatus as in claim 76 wherein said periodic excitation is a periodic voltage excitation and said periodic response is a periodic current response.

82. Apparatus as in claim 81 including an operational amplifier configured as a current-to-voltage converter.

83. Apparatus as in claim 76 wherein said periodic excitation is a periodic current excitation and said periodic response is a periodic voltage response.

84. Apparatus as in claim 83 including a viewing resistor connected in series with said electrical element.

85. Apparatus as in claim 83 including separate contacts to said element for applying said periodic current excitation and for sensing said periodic voltage response.

86. Apparatus as in claim 76 wherein said frequency response characteristic is a low-pass frequency response characteristic.

87. Apparatus as in claim 76 wherein said frequency response characteristic is a band-pass frequency response characteristic.

88. Apparatus as in claim 76 wherein said periodic excitation is a periodic square wave excitation.

89. Apparatus as in claim 76 wherein said periodic excitation is a periodic sine wave excitation.

90. Apparatus as in claim 77 wherein said computation and control circuitry is further adapted to average or sum said digital representations of said sampled values of said band-limited excitation signal over one or more periods to obtain time-averaged excitation results, to average or sum said digital representations of said sampled values of said band-limited response signal over one or more periods to obtain time-averaged response results, to numerically combine said time-averaged excitation results with appropriate sine and cosine values to evaluate excitation sine and cosine correlation integrals, to numerically combine said time-averaged response results with appropriate sine and cosine values to evaluate response sine and cosine correlation integrals, and to numerically combine said excitation sine and cosine correlation integrals and said response sine and cosine correlation integrals to evaluate at least one component of said complex self-immittance of said electrical element at said discrete frequency.

91. Apparatus as in claim 76 wherein said electrical element comprises an active electrical element and a dc blocking capacitor in series.

92. Apparatus as in claim 76 wherein said electrical element comprises an active electrical element and a dc blocking voltage in series.

93. Apparatus for evaluating at least one component of complex self-immittance of an electrical element at a discrete frequency comprising:
  means adapted to excite said element with periodic excitation characterized by a fundamental period equal to the reciprocal of said discrete frequency;
  means adapted to provide an excitation signal in accordance with said periodic excitation;
  means adapted to provide a response signal in accordance with a periodic response of said electrical element to said periodic excitation;
  means adapted to provide digital representations of sampled values of said excitation signal, said sampled values acquired at discrete excitation signal sampling times synchronized with said periodic excitation and distributed in time over one or more half-period or full-period intervals of said fundamental period;
  means adapted to provide digital representations of sampled values of said response signal, said sampled values acquired at discrete response signal sampling times synchronized with said periodic excitation and distributed in time over one or more half-period or full-period intervals of said fundamental period; and,
  means adapted to initiate said excitation signal sampling times, to initiate said response signal sampling times, and to numerically combine said digital representations of said sampled values of said excitation signal and said digital representations of said sampled values of said response signal to evaluate at least one said component of said complex self-immittance of said electrical element at said discrete frequency.

94. Apparatus as in claim 93 wherein said periodic excitation is a periodic voltage excitation and said periodic response is a periodic current response.

95. Apparatus as in claim 93 wherein said periodic excitation is a periodic current excitation and said periodic response is a periodic voltage response.

96. Apparatus as in claim 93 including means adapted to process both said excitation signal and said response signal with identical low-pass or band-pass filter response functions.

97. Apparatus for evaluating at least one component of complex self-immittance of an electrical element at a discrete frequency comprising:
  means adapted to excite said element with periodic excitation characterized by a fundamental period equal to the reciprocal of said discrete frequency;
  means adapted to provide an excitation signal in accordance with said periodic excitation;
  means adapted to provide a response signal in accordance with a periodic response of said electrical element to said periodic excitation;
  filter means characterized by a frequency response characteristic and adapted to provide a band-limited excitation signal in accordance with said frequency response characteristic and a band-limited response signal in accordance with the same said frequency response characteristic; and,
  means adapted to provide values of at least one said component of said complex self-immittance of said electrical element at said discrete frequency in accordance with said band-limited excitation signal and said band-limited response signal.

98. Apparatus as in claim 97 wherein said means adapted to provide values of at least one said component of said complex self-immittance of said electrical element at said discrete frequency comprises:
  means adapted to provide digital representations of sampled values of said band-limited excitation signal and of said band-limited response signal, said sampled values obtained at periodically repeating sample times synchronized to said periodic excitation and distributed in time over at least one half-period or full-period interval of said fundamental period of said periodic excitation; and,
  means adapted to compute at least one said component of said complex self-immittance of said electrical element at said discrete frequency from said digital representations of said sampled values of said band-limited excitation signal and of said band-limited response signal.

99. Apparatus as in claim 97 wherein said periodic excitation is a periodic voltage excitation and said periodic response is a periodic current response.

100. Apparatus as in claim 97 wherein said periodic excitation is a periodic current excitation and said periodic response is a periodic voltage response.

* * * * *

UNITED STATES PATENT AND TRADEMARK OFFICE
CERTIFICATE OF CORRECTION

PATENT NO. : 6,294,896 B1
DATED : September 25, 2001
INVENTOR(S) : Keith S. Champlin It is certified that error appears in the above-identified patent and that said Letters Patent is hereby corrected as shown below:

Title page,
Item [56], References Cited, OTHER PUBLICATIONS, change "JIS Japanese Industrial Standard-Lead Acid Batteries for Automobiles", Japanese Standards Association UDS, 621.355.2:629.113.006, Nov. 1995" to -- "JIS Japanese Industrial Standard-Lead Acid Batteries for Automobiles", Japanese Standards Association UDC, 621.355.2:629.113.006, Nov. 1995" --

Column 11,
Line 44, change $(V_1^{90})_{av}$, $(I_1^0)_{av}$, and $(I_1^{90})_{av}$" to $-- \langle V_1^{90} \rangle_{av}, \langle I_1^0 \rangle_{av},$ and $\langle I_1^{90} \rangle_{av} --$.

Column 12,
Line 13, change "$(I_1^0)_{av} + j (I_1^{90})_{av}$" to $-- \langle I_1^0 \rangle_{av} + j \langle I_1^{90} \rangle_{av} --$.

Line 14, change "$(V_1^0)_{av} + j (V_1^{90})_{av}$" to $-- \langle V_1^0 \rangle_{av} + j \langle V_1^{90} \rangle_{av} --$.

Signed and Sealed this

Twenty-seventh Day of August, 2002

Attest:

*Attesting Officer*

JAMES E. ROGAN
*Director of the United States Patent and Trademark Office*